United States Patent [19]

Kishino et al.

[11] Patent Number: 5,747,862

[45] Date of Patent: May 5, 1998

[54] SPIN-POLARIZED ELECTRON EMITTER HAVING SEMICONDUCTOR OPTO-ELECTRONIC LAYER WITH SPLIT VALENCE BAND AND REFLECTING MIRROR

[75] Inventors: Katsumi Kishino, Susukinodainidanchi 1-204,8, Susukino 2-chome, Midori-ku, Yokohama-shi, Kanagawa-ken; Toshihiro Kato, Kasugai, both of Japan

[73] Assignees: Katsumi Kishino, Yokohama; Daido Tokushuko Kabushiki Kaisha, Nagoya, both of Japan

[21] Appl. No.: 124,624

[22] Filed: Sep. 22, 1993

[30] Foreign Application Priority Data

| Sep. 25, 1992 | [JP] | Japan | 4-280822 |
| Oct. 22, 1992 | [JP] | Japan | 4-308259 |
| Oct. 22, 1992 | [JP] | Japan | 4-308260 |

[51] Int. Cl.$^6$ ............................ H01L 31/0304
[52] U.S. Cl. .................. 257/436; 257/11; 250/423 P; 313/310; 313/113
[58] Field of Search ................ 257/11, 436, 18; 250/493.1, 423 P, 123 R; 313/113, 501, 441, 442, 310; 372/45, 99

[56] References Cited

U.S. PATENT DOCUMENTS

| 4,616,241 | 10/1986 | Biefeld et al. | |
| 4,928,154 | 5/1990 | Umeno et al. | |
| 5,048,036 | 9/1991 | Scifres et al. | |
| 5,117,469 | 5/1992 | Cheung et al. | 385/11 |
| 5,132,746 | 7/1992 | Mendez et al. | |
| 5,132,981 | 7/1992 | Uomi et al. | |
| 5,315,127 | 5/1994 | Nakanishi et al. | 257/11 |
| 5,389,797 | 2/1995 | Bryan et al. | 257/21 |

FOREIGN PATENT DOCUMENTS

| 3-80573 | 4/1991 | Japan | 257/436 |

OTHER PUBLICATIONS

Physical Review Letters, vol. 66, No. 18, pp. 2376–2379, May 6, 1991, T. Maruyama et al., "Observation of Strain–Enhanced Electron–Spin Polarization in Photoemission From InGaAs".

Nuclear Instruments & Methods in Physics Research, vol. A286, No. 1/2, pp. 1–8, Jan. 1, 1990, W. Hartmann, et al., "A Source of Polarized Electrons Based on Photoemission of GaAsP".

Physics Letters, No. 158, pp. 345–349, 1991, T. Nakanishi, et al., "Large Enhancement of Spin Polarization Observed by Photoelectrons from a Strained GaAs Layer".

Applied Physics Letter, vol. 54, No. 7, pp. 632–634, Feb. 13, 1989, F. Ciccacci, et al., "Spin–Polarized Photoemission Form AlGaAs Heterojunction: A Convenient Highly Polarized Electron Source".

*Primary Examiner*—Jerome Jackson
*Assistant Examiner*—John Guay
*Attorney, Agent, or Firm*—Oblon, Spivak, McClelland, Maier & Neustadt, P.C.

[57] ABSTRACT

An electron emitting element including a semiconductor opto-electronic layer having a split valence band and capable of emitting a beam of spin-polarized electrons from an emitting surface thereof upon incidence of an excitation laser radiation upon the emitting surface, and a reflecting mirror formed on one of opposite sides of the opto-electronic layer remote from the emitting surface and cooperating with the emitting surface to effect multiple reflection therebetween of the incident laser radiation. The emitting element may be provided with a semiconductor light modulator element for modulating the intensity of the laser radiation incident upon the opto-electronic layer. A laser source may be formed integrally with the emitting element and disposed on the side of the opto-electronic layer remote from the emitting surface.

3 Claims, 19 Drawing Sheets

SPIN-POLARIZED ELECTRON EMITTER HAVING SEMICONDUCTOR OPTO-ELECTRONIC LAYER WITH SPLIT VALENCE BAND AND REFLECTING MIRROR

BACKGROUND OF THE INVENTION

1. Field of the Invention

The present invention relates in general to improvements in a spin-polarized electron beam emitting element, an electron source including such an element, and a device including such an electron source. More particularly, the present invention relates to such an element and source which assure high quantum efficiency and beam density of emitted electrons, and to such a device which is compact and easy to handle.

2. Discussion of the Related Art

A spin-polarized electron beam in which the electrons have their spins aligned in one of two opposite directions is utilized as effective means for studying or investigating the magnetic properties in the nucleus of atoms in the field of experiment on a high-energy elementary or fundamental particle, and the magnetic properties near the surface of a material in the field of material science. Spin-polarized electrons are photo-emitted from an electron emitting element including a semiconductor opto-electronic layer, by laser-exciting the opto-electronic layer. This semiconductor opto-electronic layer has energy level splitting or difference in the valence band, due to a lattice mismatch with respect to another semiconductor layer on which the opto-electronic layer is grown.

Described more specifically, the electron emitting element includes a heterojunction structure consisting of a $GaAs_{1-x}P_x$ ($x>0$) semiconductor layer, and a so-called strained GaAs semiconductor layer grown by epitaxy on the $GaAs_{1-x}P_x$ semiconductor layer. The strained GaAs layer as the opto-electronic layer indicated above has a smaller band gap than the $GaAs_{1-x}P_x$ layer, and a lattice constant slightly different from that of the $GaAs_{1-x}P_x$ layer. A lattice mismatch between the two layers constituting a heterostructure gives the GaAs layer a strain which causes splitting of the valence band, that is, a strain-dependent energy level splitting or difference of the heavy-hole and light-hole bands (sub-bands) of the valence band relative to the conduction band. The energy splitting or difference makes it possible to preferentially excite one of the heavy- and light-hole sub-bands of the valence band which has the higher energy level, namely, which has the smaller energy gap with respect to the conduction band. Therefore, by suitably tuning the excitation laser energy incident upon the GaAs semiconductor layer so as to excite one of the sub-bands of its valence band, the electrons emitted from the GaAs layer can be spin-polarized in one of the two opposite directions which corresponds to the excited sub-band.

Thus, the use of a strained opto-electronic layer assures improved spin polarization of electrons of a beam photo-emitted from an electron emitting element. The strained GaAs semiconductor layer indicated above may be replaced by a strained $GaAs_{1-y}P_y$ ($y>0$) semiconductor layer or other strained compound semiconductor layer as disclosed in Japanese Patent Application No. 4-196245 filed in the name of the assignee of the present application, or by a semiconductor of chalcopyrite type which has a split valence band by nature.

However, the conventional spin-polarized electron emitting element does not assure spin polarization of emitted electrons with sufficiently high quantum efficiency (QE), that is, suffers from a small number of electrons emitted per excitation laser input. Accordingly, the conventional emitting element requires a considerably long period of laser excitation to obtain a sufficient amount of electron beam intensity, making it difficult to achieve real-time observation or investigation of a magnetic domain of a material, for instance. Although an increase in the thickness of the opto-electronic layer will increase the number of photoemitted electrons and the quantum efficiency, this solution results in a variation in the spin polarization of the emitted electrons due to scattering within the semiconductor, unfavorably leading to reduced polarization percent.

Further, the conventional spin-polarized electron emitting element is not capable of adjusting the electron beam intensity, and therefore suffers from difficulty in observing a magnetic domain near the surface of a magnetic material, for example, while changing a relationship between the intensity of the emitted electron beam and an image observed of the material surface, with the electron beam intensity changed as a parameter.

In observing the magnetic domain on a magnetic material surface by exposure thereof to a spin-polarized electron beam photoemitted from the electron emitting element described above, the emitting element is disposed in a vacuum chamber, and the opto-electronic layer of the element is irradiated by an excitation laser generated from a suitable laser source, to photoemit a spin-polarized electron beam. The photoemitted electron beam is conducted or directed to the surface of the specimen, a magnetic material, through a transmission device connected to the vacuum chamber, as in an apparatus disclosed in the above-identified Japanese Patent Application, which is adapted to measure the spin polarization percent of a photoemitted electron beam.

SUMMARY OF THE INVENTION

It is therefore a first object of the present invention to provide an element for emitting a spin-polarized electron beam, which assures improved quantum efficiency of emitted electron, without deteriorating the spin polarization percent.

It is a second object of this invention to provide a spin-polarized electron beam source capable of adjusting the intensity of the emitted electron beam.

It is a third object of the invention to provide a device for emitting a spin-polarized electron beam, which device is compact and relatively easy to handle.

The first object indicated above may be attained according to a first aspect of the present invention, which provides an electron emitting element including a semiconductor opto-electronic layer having a split valence band, the opto-electronic layer emitting a beam of spin-polarized electrons from an emitting surface thereof upon incidence of an excitation laser radiation upon the emitting surface, the electron emitting element comprising a reflecting mirror formed on one of opposite sides of the opto-electronic layer remote from the emitting surface. The reflecting mirror reflects the laser radiation and cooperates with the emitting surface to effect multiple reflection therebetween of the laser radiation.

In the electron emitting element of the present invention constructed as described above, the excitation laser radiation incident upon the opto-electronic layer is subjected to multiple reflection between the reflecting mirror and the emitting surface of the opto-electronic layer, so that the laser radiation is passed through the semiconductor material of the opto-electronic layer several times, whereby the amount of the laser radiation absorbed by the opto-electronic layer is increased, and the number of electrons excited by the laser radiation is accordingly increased, with a result of an increase in the quantum efficiency (QE) of the electrons emitted from the emitting element. Since this increase in the quantum efficiency is provided without an increase in the thickness of the opto-electronic layer, the present electron emitting element is substantially free from reduction in the spin-polarization percent of the emitted electrons.

The second object indicated above may be achieved according to a second aspect of the invention, which provides an electron source comprising an electron emitting element with a semiconductor opto-electronic layer having a split valence band, the opto-electronic layer emitting a beam of spin-polarized electrons from an emitting surface thereof upon incidence of an excitation laser radiation upon the opto-electronic layer, the electron source comprising a semiconductor light modulating element disposed on one of opposite sides of the electron emitting element remote from the opto-electronic layer, for modulating an intensity of the laser radiation to be incident upon the opto-electronic layer.

In the electron source constructed as described above, the light modulating element is disposed on the rear side of the electron emitting element, that is, on one of opposite sides of the electron emitting element which is remote from the opto-electronic layer from which the spin-polarized electron beam is emitted. In the present light modulating element, the intensity of the excitation laser radiation to be incident upon the opto-electronic layer can be modulated to suitably adjust the intensity of the spin-polarized electron beam. Therefore, the present electron source facilitates observation of a magnetic domain near the surface of a magnetic material, for example, while changing the intensity of the spin-polarized electron beam as a parameter to obtain respective images of the magnetic domain in relation to different intensity values of the electron beam irradiating the material surface.

The semiconductor light modulating element may include a pair of electrodes, and an active layer or quantum well which is disposed between the electrodes and effects induced or stimulated emission for amplifying or modulating the intensity of the incident laser radiation upon application of a controlled electric current between the electrodes, such that the electron beam intensity varies as a function of the electric current applied.

The third object indicated above may be accomplished according to a third aspect of this invention, which provides an electron emitting device including an electron source having an electron emitting element with a semiconductor opto-electronic layer having a split valence band, and a laser source for generating an excitation laser radiation, the opto-electronic layer emitting a beam of spin-polarized electrons from an emitting surface thereof upon incidence of the laser radiation upon the opto-electronic layer, the laser source being disposed in fixed positional relationship with the electron source, and on one of opposite sides of the electron source remote from the opto-electronic layer, so that the laser radiation generated by the laser source is incident upon the electron source from the above-indicated side of the electron source which is remote from the opto-electronic layer.

In the present electron emitting device, the laser source is disposed on one side of the electron source remote from the opto-electronic layer so that the laser radiation generated by the laser source is received by the electron source, on the above-indicated side remote from the opto-electronic layer, to excite the opto-electronic layer so that a beam of spin-polarized electrons is emitted from the emitting surface of the opto-electronic layer provided on the other side of the electron source. Since the laser source has fixed positional relationship with the electron source, the present electron emitting device may be easily attached to an appropriate testing or measuring apparatus adapted to observe a magnetic domain near the surface of a magnetic material of a workpiece or test specimen, for example. For the fixed positional relationship of the laser source and the electron source, these two sources may be fixedly positioned in a suitable housing such that the housing maintains the fixed positional relationship and such that the emitting surface of the electron emitting element of the electron source is exposed to a vacuum chamber provided in the measuring apparatus in which the workpiece is suitably positioned. The housing may be constructed for easy attachment and removal to and from the apparatus. Alternatively, the electron source and the laser source may be formed as an integral structure in which the electron and laser sources are integrally bonded together for fixed positional relationship with each other. In this case, the integral structure may be readily positioned in a suitable housing to be attached to the measuring apparatus.

As described above, the present electron emitting device is a compact unitary device which is easy to handle, namely, readily connectable to a desired apparatus designed for a desired application such as experiment, observation, testing or measurement using a spin-polarized electron beam. The present device may be used with different types of such apparatuses such as those for observing a magnetic domain.

BRIEF DESCRIPTION OF THE DRAWINGS

The above and optional objects, features and advantages of the present invention will be better understood by reading the following detailed description of presently preferred embodiments of the invention, when considered in connection with the accompanying drawings, in which.

DETAILED DESCRIPTION OF THE PREFERRED EMBODIMENTS

Figure 1:
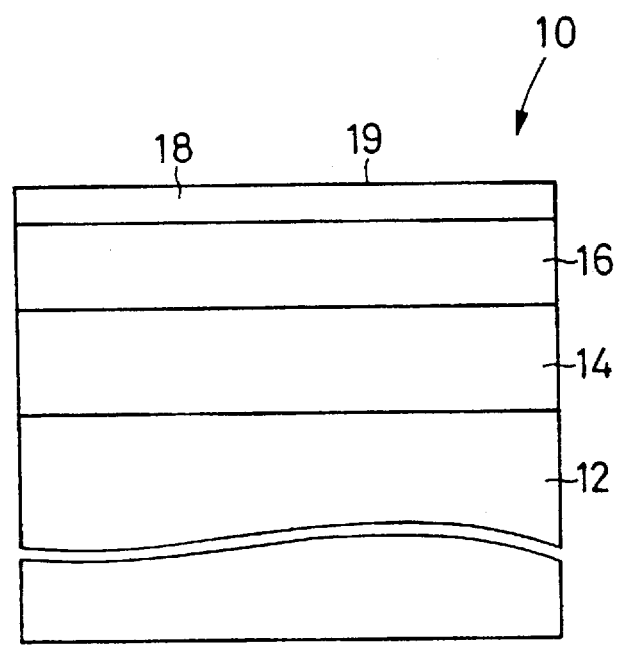
FIG. 1 is a view illustrating a structure of an electron element for emitting a spin-polarized electron beam, which includes a multilayered reflecting mirror constructed according to one embodiment of the present invention.
Figure 2:
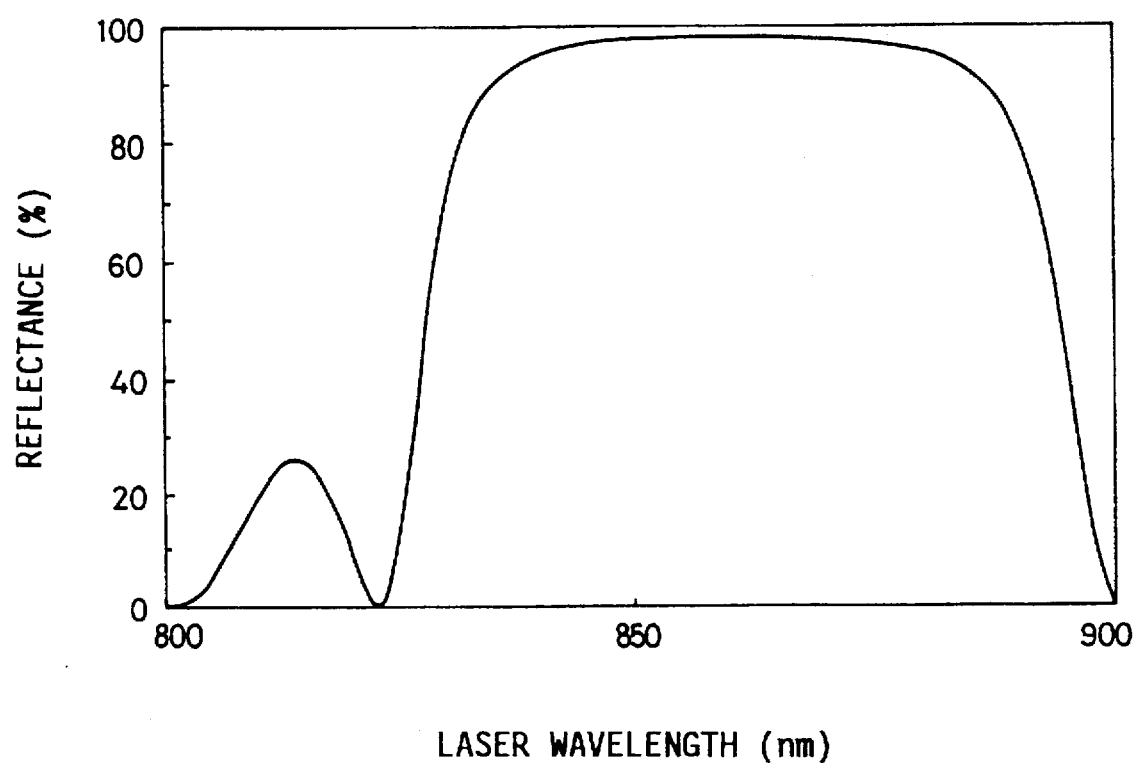
FIG. 2 is a graph indicating a relationship between the reflectance of the reflecting mirror used in the electron emitting element of FIG. 1, and the wavelength of an excitation laser incident upon the emitting element.

Referring first to FIG. 1, an element for emitting a spin-polarized electron beam is shown generally at 10. The electron emitting element 10 consists of a substrate 12, and three semiconductor layers 14, 16 and 18 grown by epitaxy in the order of description on the substrate 12, by using an MOCVD (metal organic chemical vapor deposition) apparatus well known in the art. The substrate 12 is a p-GaAs layer having about 350 µm thickness as measured normal to (100) plane, which is doped with Zn as an impurity to a carrier concentration of about $5\times10^{18}$ (cm$^{-3}$). The semiconductor layer 14 is a multilayered reflecting mirror consisting of 30 pairs of alternating 67 nm-thick p-Al$_{0.6}$Ga$_{0.4}$As layers and 61 nm-thick p-Al$_{0.1}$Ga$_{0.9}$As layers. This multilayered reflecting mirror 14 has a reflectance which varies with the wavelength (nm) of an excitation laser incident upon the element 10, as indicated in the graph of FIG. 2. The two semiconductor layers of the reflecting mirror 14 are also doped with Zn as an impurity to a carrier concentration of about $5\times10^{18}$ (cm$^{-3}$). The thickness values of the two semiconductor layers of the reflecting mirror 14 may be suitably determined depending upon their refractive index values and the wavelength of the excitation laser to be reflected.

The layers 16 and 18 formed on the reflecting mirror 14 will be referred to as first and second semiconductor layers, respectively. The first semiconductor layer 16 is a p-GaAs$_{0.83}$P$_{0.17}$ layer having about 2.0 µm thickness and doped with Zn to a carrier concentration of about $5\times10^{18}$ (cm$^{-3}$), while the second semiconductor layer 18 is a p-GaAs layer having about 0.085 µm thickness and doped with Zn to a carrier concentration of about $5\times10^{18}$(cm$^{-3}$). The p-GaAs layer 18 has a band gap smaller than that of the p-GaAs0.83P$_{0.17}$ layer 16, and the two layers 16, 18 have different lattice constants or a lattice mismatch, whereby the second semiconductor layer 18 is strained, in heterojunction with the first semiconductor layer 16. A strain due to the lattice mismatch of the second semiconductor layer 18 causes splitting of the valence band, that is, defines energy level splitting or difference between the heavy-hole and light-hole sub-bands of the valence band. This energy splitting makes it possible to preferentially excite the heavy-hole sub-band having the higher energy level, by suitably tuning the excitation laser energy to be incident upon the second semiconductor layer 18. Thus, it is possible to spin-polarize the electrons photoemitted from the layer 18 upon excitation by the laser, such that the emitted electrons have their spin aligned in one of two opposite directions corresponding to the heavy-hole and light-hole sub-bands of the valence band, namely, in the direction corresponding to the excited heavy-hole sub-band.

In the present embodiment, the second semiconductor layer 18 serves as an opto-electronic layer from which a beam of spin-polarized electrons is emitted upon incidence of an excitation laser radiation. It is noted that the illustration in FIG. 1 does not accurately represent the thickness values of the individual layers 12, 14, 16, 18 of the electron emitting element 10. The second semiconductor layer or opto-electronic layer 18 has an electron emitting surface 19, which is not covered with any film and is externally exposed, such as an oxidation preventive film. The reflecting mirror 14 is formed on one of opposite sides of the opto-electronic layer 18 remote from the emitting surface 19.

Figure 3:
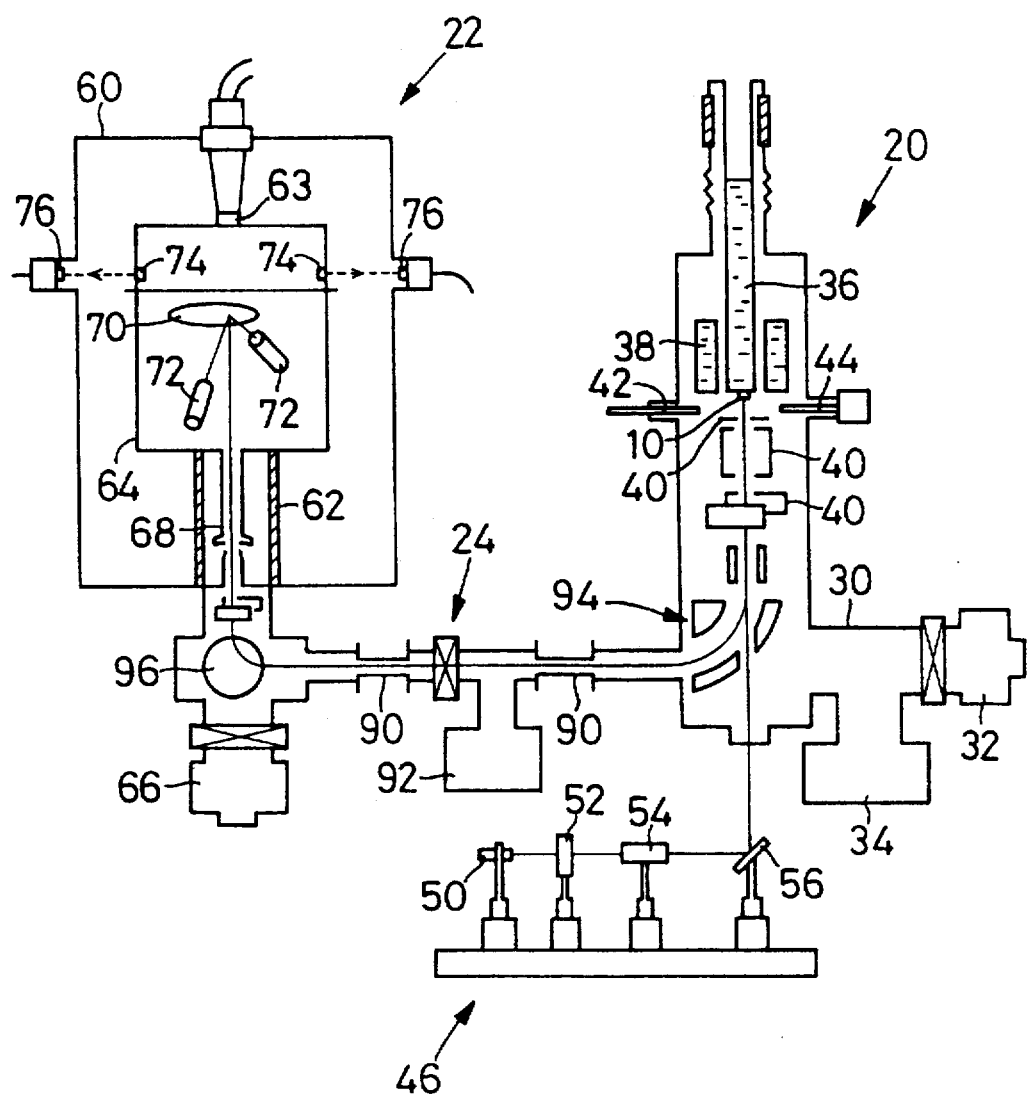
FIG. 3 is an apparatus for measuring the spin polarization percent of a spin-polarized electron beam emitted from an emitting element as shown in FIG. 1.

Referring to FIG. 3, there is shown an apparatus which incorporates the electron emitting element 10 and is adapted to measure the spin polarization of an electron beam emitted from the element 10. The apparatus includes an electron emitting device (electron gun) 20, a spin-polarization analyzer 22, and an electron transmission device 24 for conducting or directing the spin-polarized electron beam from the electron emitting device 20 to the spin-polarization analyzer 22.

The electron emitting device 20 has: a vacuum housing 30 resistant to a highly reduced pressure; a turbo-molecular pump 32 and an ion pump 34 for evacuating the vacuum housing 30 to about $10^{-9}$ torr within the vacuum housing 30; a first container 36 and a second container 38; a plurality of electrodes 40 for enabling the emitting element 10 to emit electrons from its emitting surface 19; a cesium activator 42 for emitting cesium (Cs) toward the emitting surface 19 of the emitting element 10; an oxygen activator 44 for emitting oxygen (O$_2$) toward the emitting surface 19; and a laser generator 46 for irradiating the emitting surface 19 with a laser radiation. The first container 36 is disposed in the vacuum housing 30 so as to hold the electron emitting element 10 on its bottom such that the element 10 is cooled by a liquid nitrogen contained in the container 36. The second container 38 is an annular container disposed so as to surround a lower portion of the first container 36. This container 38 also contains liquid nitrogen gas for adsorbing residual gases within the vacuum housing 30. The laser generator 46 includes a tunable laser source 50 capable of generating a laser radiation whose wavelength is selectable within a range between 700 nm and 900 nm, for example. The laser generator 46 further includes a polarizer 52 for transmitting only linearly or plane polarized light, a quarter-wavelength plate 54 for converting the linearly polarized light into circularly polarized light, and a mirror 56 reflecting the circularly polarized light. The laser generator 46 is positioned relative to the electron emitting device 20 so that the circularly polarized light is incident upon the electron emitting surface 19 of the electron emitting element 10 held in the vacuum housing 30.

The spin-polarization analyzer 22 has a high-voltage chamber in the form of a Mott scattering chamber 64 which is disposed within a freon-filled tank 60 and supported by a high-voltage insulator 62. The Mott scattering chamber 64 is energized by a high voltage of 100 kV applied thereto from an anode 63. The Mott scattering chamber 64 communicates with a turbo-molecular pump 66, for evacuation of the chamber 64 to about $10^{-6}$ torr. The analyzer 22 also has: an accelerator electrode 68 disposed within the insulator 62, for accelerating the spin-polarized electron beam; a pair of surface barrier detectors 72 disposed within the Mott scattering chamber 64, for detecting the electrons scattered in the direction of $\theta=120°$ by collision against the nuclei of gold atoms of a gold foil 70 supported on a disk (not shown); a pair of light emitting diodes 74 which convert electric outputs of pre-amplifiers 84 (FIG. 4) connected to the surface barrier detectors 72, into optical signals; and a pair of photo-detectors 76 which covert the optical outputs of the light emitting diodes 74 into electrical signals.

Figure 4:
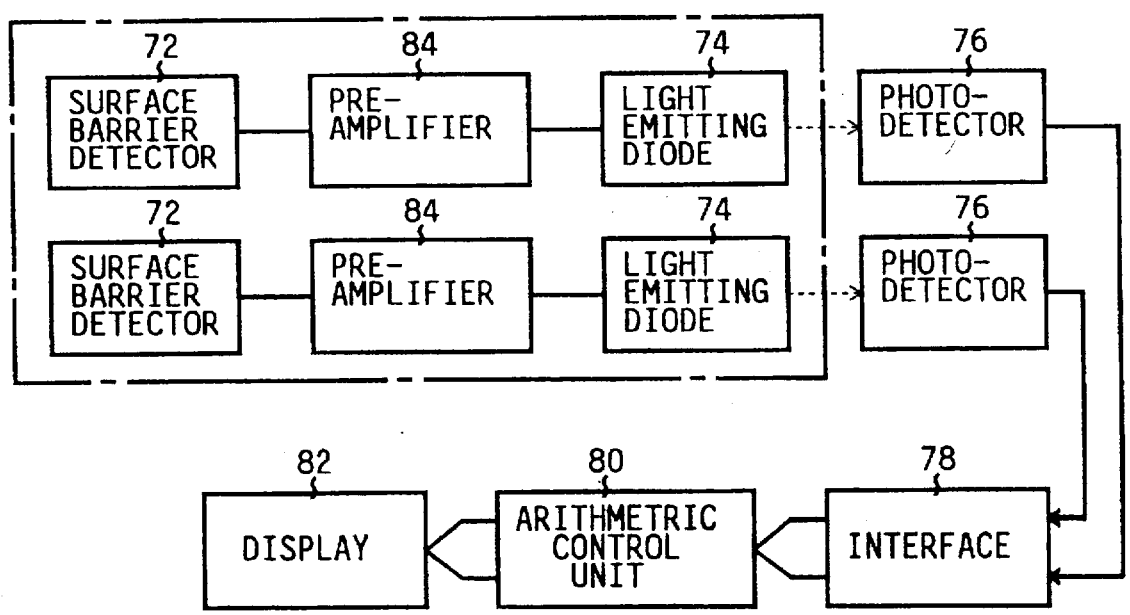
FIG. 4 is a block diagram showing a circuit of the apparatus of FIG. 3 for measuring the spin polarization percent.

Referring to the block diagram of FIG. 4, there is shown a circuit for calculating the spin-polarization percent of the electron beam incident upon the analyzer 22, which is equipped with the two surface barrier detectors 72 disposed in the Mott scattering chamber 64, as described above. The circuit has two channels associated with the respective two surface barrier detectors 72. The electric signal produced by each surface barrier detector 72 is amplified by the corresponding pre-amplifier 84, and the thus amplified electric signal is converted by the corresponding light emitting diode 74 into an optical signal. This optical signal is converted, by the corresponding photo-detector 76, into an electric signal which is applied to an arithmetic control unit through an interface 78. Based on the electric signals corresponding to the two surface barrier detectors 72, the arithmetic control unit 80 calculates the spin-polarization percent of the electrons of the beam incident upon the gold foil 70, according to a predetermined equation stored therein. The unit 80 commands a display 82 to indicate the calculated spin-polarization percent.

Referring back to FIG. 3, the electron transmission device 24 includes: a pair of tubes 90 which have a relatively small diameter and a relatively low conductance and partially define a beam path connecting the vacuum housing 30 of the electron emitting device 20 and the Mott scattering chamber 64 of the spin-polarization analyzer 22; an ion pump 92 communicating with a portion of the beam path between the two tubes 90; a spherical condenser 94 adapted to electro-statically deflect the electron beam emitted from the electron emitting element 10, through 90° to direct the beam into the beam path indicated above. That is, the direction of emission of the electron beam from the element 10 is perpendicular to the direction of extension of a portion of the beam path which is partially defined by the tubes 90; and a Helmholtz coil device 96 adapted to magnetically deflect the electron beam through 90° to direct the beam toward the Mott scattering chamber 64.

It will be understood that the spherical condenser 94 and the Helmholtz coil device 96 may be eliminated if the vacuum housing 30 and the Mott scattering chamber 64 are aligned with each other for straight propagation of the electron beam from the electron emitting element 10 to the Mott scattering chamber 64.

Since the electron emitting element 10 does not have any oxidation preventive film covering the emitting surface 19, the element 10 is stored in a vacuum desiccator immediately after the epitaxial growth of the layers 14, 16, 18 on the substrate 12, and just before the element 10 is set in the vacuum housing 30 of the electron emitting device 20. To measure the spin-polarization percent of electrons emitted from the emitting element 10, the element is first fixed to the underside of the bottom wall of the first container 36, and the vacuum housing 30 is then evacuated to about $10^{-9}$ torr, heated to about 420° C. and kept at this elevated temperature for about 15 minutes for cleaning the emitting surface 19 of the element 10. Subsequently, the cesium activator 42 and the oxygen activator 44 are operated one after the other, to emit cesium (Cs) and oxygen ($O_2$) toward the emitting surface 19 of the element 10, so that trace amounts of cesium and oxygen are adsorbed on the emitting surface 19. This adsorption of cesium and oxygen establishes negative electron affinity (so-called "NEA") on the emitting surface 19 of the element 10. The negative electron affinity means a negative energy gap corresponding to a difference between the energy level of an electron at the bottom of the conduction band and that of an electron in vacuum. Then, the electron emitting element 10 is irradiated with a circularly polarized laser radiation emitted from the laser generator 46, at the room temperature of the element 10, that is, without cooling of the element 10 by liquid nitrogen. Upon incidence of the circularly polarized laser radiation upon the second semiconductor layer or opto-electronic layer 18 of the element 10, a group of spin-polarized electrons is emitted from the emitting surface 19, and a beam of the electrons is directed by the electrodes 40 toward the spherical condenser 94, whereby the electron beam is transmitted to the Mott scattering chamber 64 through the transmission device 24, and is eventually incident upon the gold foil 70 in the chamber 64. The spin-polarization percent of the electrons of the incident beam is measured by the circuit schematically illustrated in the block diagram of FIG. 4.

Figures 5A, 5B:
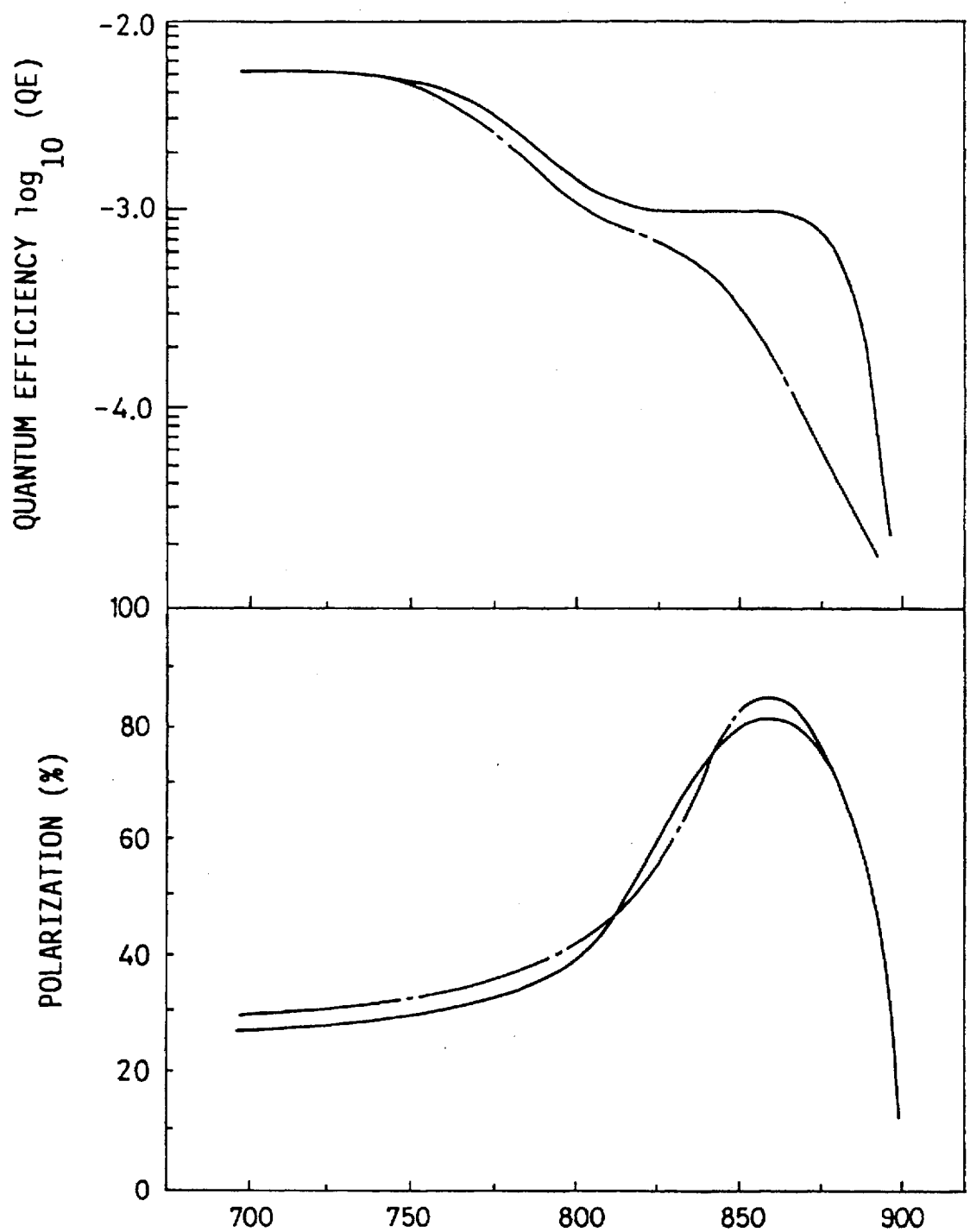
FIG. 5 is a graph indicating the spin polarization percent and the quantum efficiency measured by the apparatus of FIG. 3, as compared with those of a spin-polarized electron beam emitted from a known electron emitting element not equipped with a multilayered reflecting mirror.

The quantum efficiency (QE) and the spin-polarization percent of the electron beam emitted from the present electron emitting element 10 and incident upon the gold foil 70 were measured with the wavelength of the excitation laser radiation changed over a range of 700–900 nm. The measurements are indicated by solid lines in FIG. 5. One-dot chain lines in the same figure indicate the measurements where the first and second semiconductor layers 16, 18 are grown directly on the substrate 12, without the multilayered reflecting mirror 14 interposed between the substrate 12 and the first semiconductor layer 16. It will be understood from the measurements that the spin-polarization percent of the electron beam emitted from the electron emitting element 10 according to the present invention is remarkably high at the excitation laser wavelength in the neighborhood of 860 nm. Described more specifically, the laser radiation whose wavelength is tuned to about 860 nm permits preferential excitation of the heavy-hole sub-band of the valence band of the laser-irradiated opto-electronic layer 18, whereby the electrons emitted from the emitting surface 19 have their spins aligned in the direction corresponding to the heavy-hole sub-band.

In the electron emitting element 10 constructed according to the principle of the present invention, the excitation laser radiation incident upon the emitting surface 19 is reflected by the multilayered reflecting mirror 14, and about 30% of the laser radiation reflected by the mirror 14 is reflected by the emitting surface 19 of the layer 18 back towards the reflecting mirror 14. Thus, the incident excitation laser radiation is subjected to multiple reflection, namely, reflected back and forth several times between the reflecting mirror 14 and the emitting surface 19, whereby the laser radiation is passed several times through the semiconductor material of the opto-electronic layer 18, with a result of an increase in the amount of energy absorbed by the opto-electronic layer 18. Accordingly, the quantum efficiency (QE) is significantly improved over a wavelength range of the laser radiation reflected by the reflecting mirror 14, as is apparent from FIGS. 2 and 5. The wavelength range over which the spin-polarization of the electrons is considerably high is covered by the wavelength range in which the reflectance of the reflecting mirror 14 is sufficiently high. In other words, the wavelength range in the neighborhood of 860 nm is covered by the wavelength range in which the mirror 14 reflects the laser radiation with sufficiently high reflectance. Therefore, the excitation of the electron emitting element 10 by a laser radiation having a wavelength in the neighborhood of 860 nm permits the element 10 to emit highly spin-polarized electrons with high quantum efficiency. Since the thickness of the opto-electronic layer 18 of the present element 10 is the same as that of the comparative specimen without the reflecting mirror 14, the spin-polarization of the electrons emitted from the element 10 is substantially the same as that of the electrons emitted from the comparative specimen.

Figure 6:
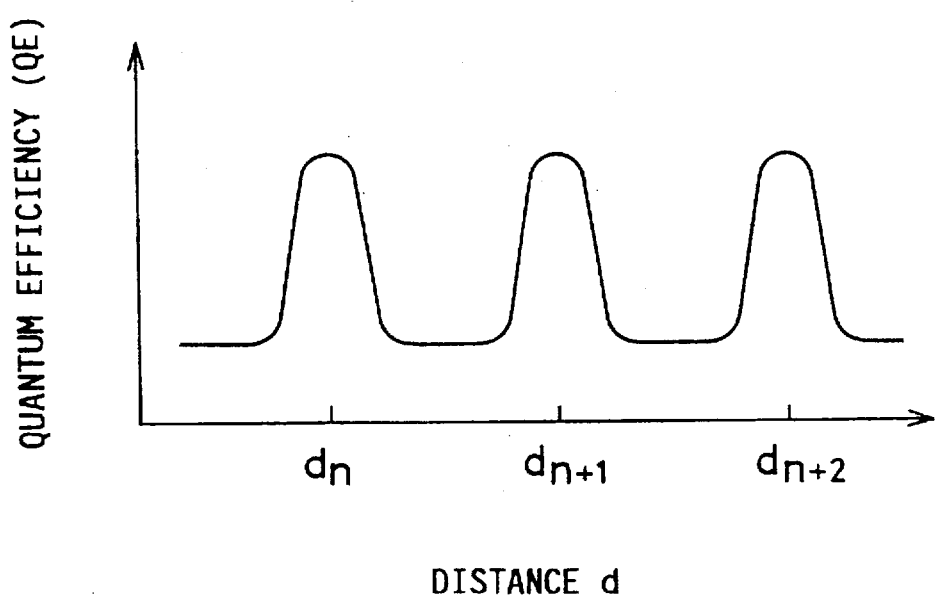
FIG. 6 is a graph indicating a relationship between the quantum efficiency and a distance between the emitting surface and the reflecting mirror of the emitting element.

It is desirable that a distance d between the reflecting mirror 14 and the electron emitting surface 19 of the element 10 be determined so that the excitation laser radiation is resonated between the mirror 14 and the emitting surface 19. This resonance of the incident laser radiation was found effective to prevent reduction of laser radiation due to the interference during multiple reflection between the mirror 14 and the emitting surface 19, and promote absorption of the laser energy in the opto-electronic layer 18 over a wavelength range in the neighborhood of the resonance wavelength, whereby the quantum efficiency is accordingly improved. That is, the improvement in the quantum efficiency depends upon and varies with the distance d between the mirror 14 and the emitting surface 19, as indicated in the graph of FIG. 6. The graph shows distances $d_n$, $d_{n+1}$, $d_{n+2}$ at which the condition to induce the resonance of the laser radiation is satisfied, and at which the quantum efficiency is relatively high. Therefore, it is desirable to determine the distance d to be equal to $d_n$, $d_{n+1}$, $d_{n+2}$, etc. or sufficiently close to that distance, on the basis of the wavelength of the incident laser radiation and the refractive index of the opto-electronic GaAs layer 18. More specifically, the distance d is desirably determined so that a value $2(t_1 n_1 + t_2 n_2)$ is a multiple of the wavelength of the incident laser radiation, where $t_1$ and $t_2$ represent the thickness values of the first and second semiconductor layers 16, 18, respectively, while $n_1$ and $n_2$ represent the refractive indices of the layers 16, 18, respectively. For strict determination of the distance d, it is necessary to determine the resonance condition of the laser radiation, by considering an effect of the distance of penetration of the laser radiation into the reflecting mirror 14 past the boundary with respect to the first semiconductor layer 16.

Figure 7:
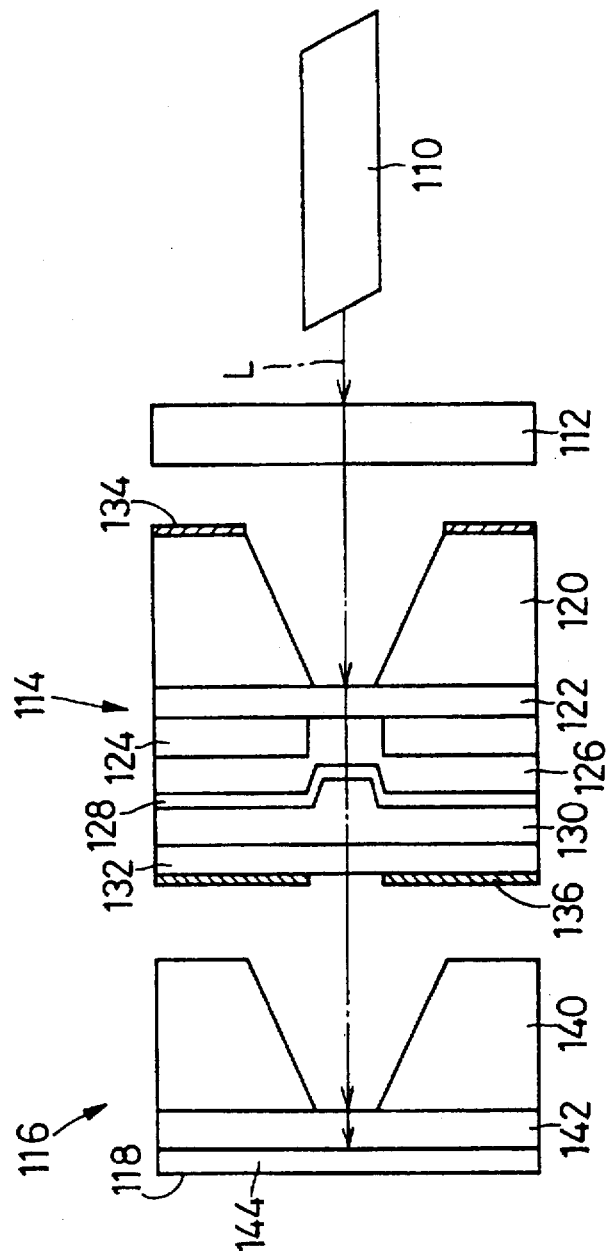
FIG. 7 is a view showing a basic arrangement of an electron emitting device equipped with a spin-polarized electron source according to another embodiment of this invention.
Figure 8:
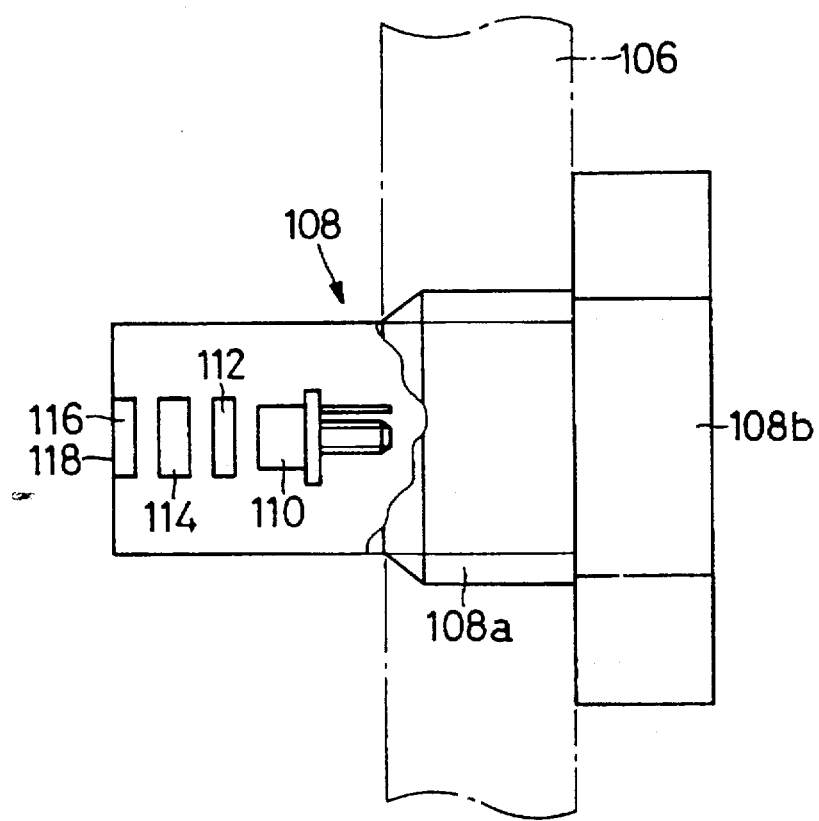
FIG. 8 is a view illustrating an example of a housing of the electron emitting device of FIG. 7.

Referring next to FIG. 7, there is shown a basic arrangement of an electron emitting device constructed according to another embodiment of the present invention. The electron emitting device includes a laser source 110, a quarter-wavelength plate 112, a semiconductor light modulating element in the form of an optical amplifier 114, and an electron emitting element 116. The optical amplifier 114 cooperates with the electron emitting element 116 to constitute a spin-polarized electron source for emitting a beam of spin-polarized electrons. The components 110, 112, 114 and 116 of the electron emitting device are formed independently of each other and fixedly positioned relative to each other within a support housing 108, as shown in FIG. 8, and the housing 108 is removably attached to a vacuum chamber 106 of a testing or measuring apparatus which is adapted to irradiate a magnetic material of a test specimen or workpiece with a beam of spin-polarized electrons, for observing a magnetic domain of the workpiece, for example. As described below, the spin-polarized electron beam is emitted from an electron emitting surface 118 of the emitting element 116. The emitting element 116 is positioned such that the electron emitting surface 118 is exposed to the interior of the vacuum chamber 106. The housing 108 has an externally threaded portion 108a, and an engaging portion 108b which is engageable with a suitable tool for screwing the housing 108 to the vacuum chamber 106 at the externally threaded portion 108a. The housing 108 is provided with sealing means for securing pressure tightness with respect to the vacuum chamber 106.

The laser source 110 may be a semiconductor laser element constructed to generate a laser radiation L having a wavelength of about 850 nm, for example. The laser radiation L is converted by the quarter-wavelength plate 112 into a circularly polarized light, which is then incident upon the optical amplifier 114. The laser radiation L whose intensity is amplified by the optical amplifier 114 is used as an excitation laser radiation incident upon the electron emitting element 116, so that a beam of spin-polarized electrons is emitted from the electron emitting surface 118 of the emitting element 116. The optical amplifier 114 is disposed on one of opposite sides of the emitting element 116 remote from the emitting surface 118.

The optical amplifier 114 provided as a semiconductor light modulating element, which is similar to a double heterostructure DBR (distributed-Bragg reflector) surface emitting laser diode, has a multilayered semiconductor reflecting mirror 122, an n-GaAs semiconductor current blocking layer 124, a p-$Al_{0.4}Ga_{0.6}As$ semiconductor cladding layer 126, a p-$Al_{0.03}Ga_{0.97}As$ semiconductor active layer 128, an n-$Al_{0.4}Ga_{0.6}As$ semiconductor cladding layer 130, and a multilayered semiconductor reflecting mirror 132, which are grown, by an epitaxial crystal growth technique such as MOCVD on a p-GaAs semiconductor substrate 120, on the order of description. The reflecting mirror 122 consists of 40 pairs of alternating p-$Al_{0.6}Ga_{0.4}As$ and p-$Al_{0.1}Ga_{0.9}As$ semiconductor layers superposed on each other, while the reflecting mirror 132 consists of 15 pairs of alternating n-$Al_{0.6}Ga_{0.4}As$ and n-$Al_{0.1}Ga_{0.9}As$ semiconductor layers superposed on each other. The thickness values of these reflecting mirrors 122, 132 are determined depending upon the refractive indices of their semiconductor materials and the wavelength of the incident laser radiation L. The layers 124, 126, 128 and 130 have thickness values of 2 µm, 2 µm, 0.1 µm and 2 µm, respectively. Electrodes 134, 136 are formed on the rear surface of the substrate 120 and the front surface of the reflecting mirror 132, respectively. With an electric current applied between the electrodes 134, 136 in a forward direction, the intensity of the incident laser radiation L is amplified owing to induced or stimulated emission in the active layer 128. The optical amplification ratio of the optical amplifier 114 varies with the amount of the electric current applied between the electrodes 134, 136. Accordingly, the intensity of the laser radiation L to be incident upon the electron emitting element 116 is modulated by the electric input in the form of an electric current applied to the amplifier 114. The current blocking layer 124 and the substrate 120 have respective central openings formed by etching. The current blocking layer 124 is provided to permit a flow of an electric current through only a central portion of the optical amplifier 114.

It is noted that the thickness values of the individual semiconductor components of the amplifier 114, electron emitting element 116, etc. in the present embodiment and those of the other components used in the following embodiments are not accurately represented by the appropriate figures such as FIG. 7, but are indicated for illustrative purposes only.

The electron emitting element 116 is produced by forming a first and a second semiconductor layer 142, 144 on a semiconductor substrate 140 by an MOCVD or other epitaxial crystal growth technique. As indicated above, the substrate 140 has a central opening formed by etching, so that the corresponding central portion of the second semiconductor layer 142 is exposed. The substrate 140 is a p-GaAs layer having about 350 µm thickness as measured normal to (100) plane, which is doped with Zn as an impurity to a carrier concentration of about $5 \times 10^{18}(cm^{31\ 3})$. The first and second semiconductor layers 142 and 144 are similar to the first and second semiconductor layers 16, 18 shown in FIG. 1, respectively. Namely, the first layer 142 is a Zn-doped p-GaAs$_{0.83}$P$_{0.17}$ layer having about 2.0 µm thickness, while the second semiconductor layer 144 is a Zn doped p-GaAs layer having about 0.085 µm thickness. The p-GaAs layer 144 has a band gap smaller than that of the p-GaAs$_{0.83}$P$_{0.17}$ layer 142, and the two layers 142, 144 have different lattice constants or a lattice mismatch, whereby the second semiconductor layer 144 is strained, in heterojunction with the first semiconductor layer 142. A strain due to the lattice mismatch of the second semiconductor layer 144 causes splitting of the valence band or defines energy level splitting or difference between the heavy-hole and light-hole sub-bands of the valence band. This energy splitting makes it possible to preferentially excite the heavy-hole sub-band having the higher energy level, by suitably tuning the energy of the excitation laser radiation L to be incident upon the second semiconductor layer 144. Thus, it is possible to spin-polarize the electrons photoemitted from the layer 144 upon excitation by the laser radiation L, such that the emitted electrons have their spin aligned in one of two opposite directions corresponding to the heavy-hole and light-hole sub-bands of the valence band.

In the present embodiment of FIG. 7-8, the second semiconductor layer 144 serves as an opto-electronic layer having an electron emitting surface 118, and the emitting element 116 and the optical amplifier 114 cooperate to provide a source for emitting a spin-polarized electron beam. The wavelength of the laser radiation L is selected depending upon the opto-electronic layer 144.

Figure 9:
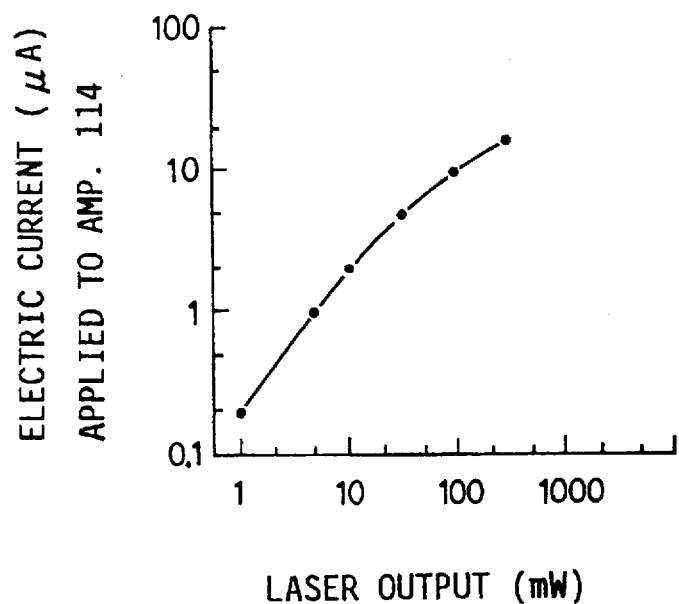
FIG. 9 is a graph indicating a relationship between the current of a spin-polarized electron beam and the exciting laser output.

In the electron emitting device of FIG. 7, the circularly polarized laser radiation L from the quarter-wavelength plate 112 is received by the electron emitting element 116 through the optical amplifier 114. The density of the electrons excited by the laser radiation L can be adjusted, as indicated in FIG. 9, for example, by changing the electric current applied to the optical amplifier 114 and thereby modulating the intensity of the laser radiation L. The adjustment of the density of the electrons facilitates observation of a magnetic domain near the surface of a magnetic material, for example, while changing a relationship between the intensity or magnitude of the emitted electron beam and an image observed of the material surface, with the electron beam intensity changed as a parameter. The electron beam emitted from the element 116 may be modulated as a pulse having a pulse width of 10 µsec and a duty cycle of 1/10, for example, to which the workpiece material is exposed for observation.

Figure 10:
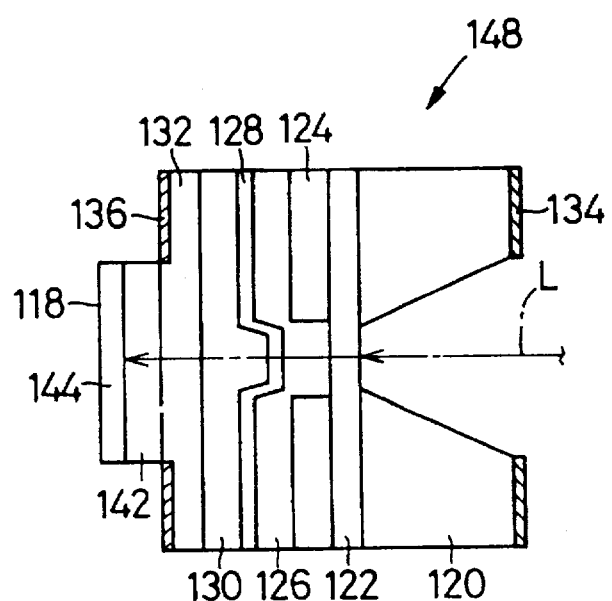
FIG. 10 is a view showing a further embodiment of the invention.

Referring to FIG. 10, another form of a spin-polarized electron source 148 will be described. This electron source 148 has an integral semiconductor structure consisting of the optical amplifier 114 and the electron emitting element 116 without the substrate 140. That is, the first and second semiconductor layers 142, 144 are successively formed directly on the reflecting mirror 132 of the optical amplifier 114, before the electrode 136 is formed. Then, outer portions of the layers 142, 144 are removed by etching so as to expose the corresponding outer portion of the reflecting mirror 132, and the electrode 136 is formed on the exposed surface of the reflecting mirror 132. The present electron source 148 has the same advantage as the electron source 114, 116 of the electron emitting device of FIG. 7. In addition, the integral semiconductor structure assures easier handling of the electron source 148. In the present embodiment, the elements 122, 124, 126, 130, 132 formed on the substrate 120 and the electrodes 134, 136 constitute a semiconductor light modulating element, while the first and second semiconductor layers 142, 144 serve as an electron emitting element. The light modulating element and the electron emitting element cooperate to provide the spin-polarized electron source 148.

Figure 11:
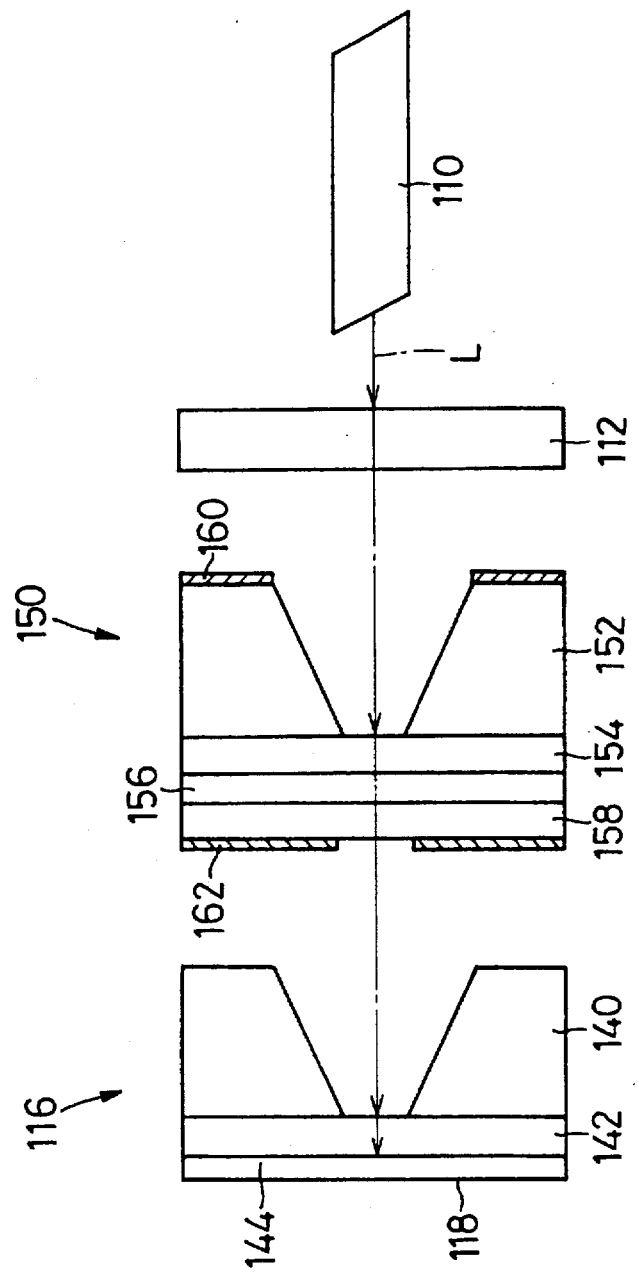
FIG. 11 is a view corresponding to that of FIG. 7, showing a still further embodiment of this invention.

Reference is now made of FIG. 11, which shows a semiconductor light modulating element in the form of an optical modulator 150 equipped with a multiple quantum well (MQW) in place of the optical amplifier 114. The optical modulator 150 includes an n-GaAs semiconductor substrate 152, and an n-Al$_{0.3}$Ga$_{0.7}$As cladding layer 154 and an MQW 156, a p-Al$_{0.3}$Ga$_{0.7}$As cladding layer 158, which are grown by epitaxy (such as MOCVD) in the order of description. The substrate 152 has a central opening formed by etching, and electrodes 160, 162 are formed on the rear surface of the substrate 152 and the front surface of the cladding layer 158, respectively. The MQW 156 consists of alternating 10 nm-thick GaAs semiconductor layers and 50 nm-thick Al$_{0.3}$Ga$_{0.7}$As semiconductor layers, which are formed so as to provide 10 quantum wells. The cladding layers 154, 158 each have a thickness of 2.0 µm. In the present optical modulator 150, application of an electric current between the two electrodes 160, 162 in a forward direction will cause induced or stimulated emission in the MQW 156, permitting the modulation of the intensity of the laser radiation L incident upon the optical modulator 150. That is, the intensity of the incident laser radiation L is modulated to adjust the density of the electrons emitted from the electron emitting element 116, depending upon the electric current to be applied to the optical modulator 150, in the same manner as described above with respect to the electron source shown in FIG. 7.

The embodiment of FIG. 11 may be modified such that the first and second semiconductor layers 142, 144 are directly formed on the cladding layer 158 of the optical modulator 150, to obtain a spin-polarized electron source having an integral structure as in the embodiment of FIG. 10. Semiconductor or dielectric multilayered reflecting mirrors may be formed on the rear surface of the cladding layer 154 and the front surface of the cladding layer 158, so that the incident laser radiation L is resonated between these reflecting mirrors. The optical modulator 150 may have a current blocking layer for permitting an electric to flow through only a central portion thereof.

Figure 12:
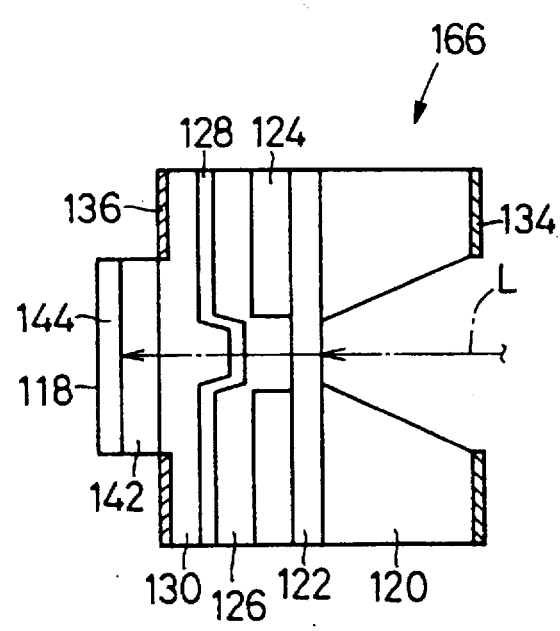
FIGS. 12 and 13 are views showing still further embodiments of the invention.

Referring to FIG. 12, there is shown a further form of a spin-polarized electron source 166, which is a modification of the electron source 148 of FIG. 10. That is, the electron source 166 does not have the reflecting mirror 132 as provided in the electron source 148, and the electrode 136 is formed directly on the cladding layer 130. In the instant embodiment, the laser radiation L intensity-modulated by the active layer 128 is incident upon the second semiconductor layer 144 of the electron emitting element, with passing through the reflecting mirror 132. However, about 30% of the incident laser radiation L is reflected by the electron emitting surface 118, and therefore the laser radiation L is more or less subjected to multiple reflection between the emitting surface 118 and the reflecting mirror 122, whereby the intensity modulation of the laser radiation L by the active layer 128 is amplified, and the amount of the laser radiation L absorbed by the second semiconductor layer 144 is accordingly increased to improve the quantum efficiency (QE) of the electrons emitted from the emitting surface 118. The degree of this improvement in the quantum efficiency varies with a distance d between the emitting surface 118 and the reflecting mirror 122. As described above with respect to the electron emitting element of FIG. 1 by reference to the graph of FIG. 6, a sufficiently high quantum efficiency is obtained with the distance $d_n$, $d_{n+1}$, $d_{n+2}$, etc. that satisfies the condition to establish the resonance of the laser radiation L. It is desirable to determine the distance d (i.e., total thickness of the layers 124, 126, 128, 130, 142 and 144) to be equal to $d_n$, $d_{n+1}$, $d_{n+2}$, etc. or sufficiently close to that distance, on the basis of the wavelength of the incident laser radiation L, the refractive index of the opto-electronic layer 144, and the distance of penetration of the laser radiation reflected by the emitting surface 118 into the reflecting mirror 122 past the boundary on the side of the current blocking layer 124. In the present embodiment, the substrate 120, layers 122, 124, 126, 128 and 130 and electrodes 134, 136 provide a semiconductor light modulating element, while the first and second semiconductor layers 142, 144 serve as an electron emitting element.

Figure 13:
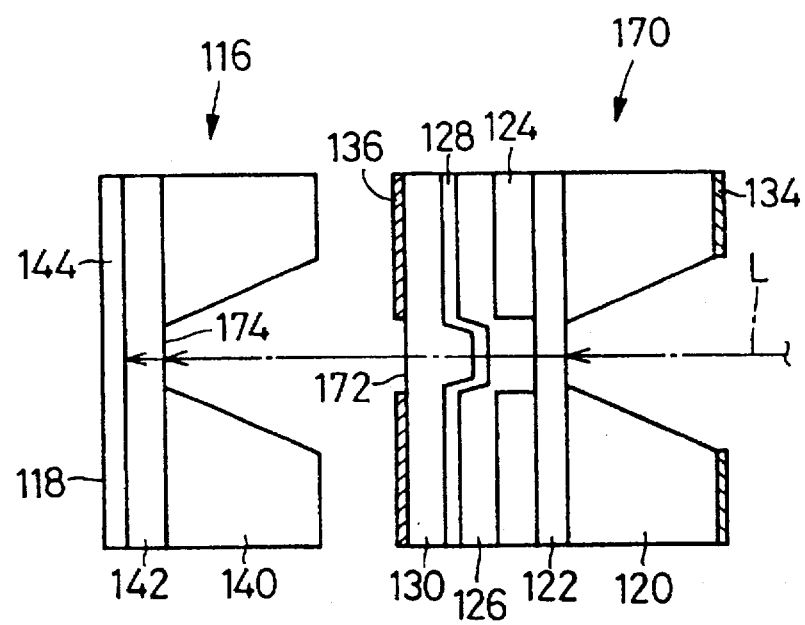

FIG. 13 shows an optical amplifier 170 in place of the optical amplifier 114 of FIG. 7. Namely, the optical amplifier 170 does not have the reflecting mirror 132. In this arrangement, the laser radiation L intensity-modulated by the active layer 128 is incident directly upon the first semiconductor layer 142, without passing through the mirror 132. Although the reflecting mirror 132 may be eliminated, a front exposed surface 172 of the optical amplifier 170 and a exposed rear surface 174 of the first semiconductor layer 142 are both preferably coated with non-reflective films, so that the laser radiation L is resonated between the emitting surface 118 and the reflecting mirror 122, so as to amplify the intensity modulation of the laser radiation L and accordingly increase the quantum efficiency, as in the embodiment of FIG. 12.

It is noted that a reflecting mirror may be provided on the rear surface of the cladding layer 154 of the optical modulator 150 of FIG. 11, to permit resonance of the laser radiation L between this reflecting mirror and the emitting surface 118, as in the embodiments of FIGS. 12 and 13.

Figure 14:
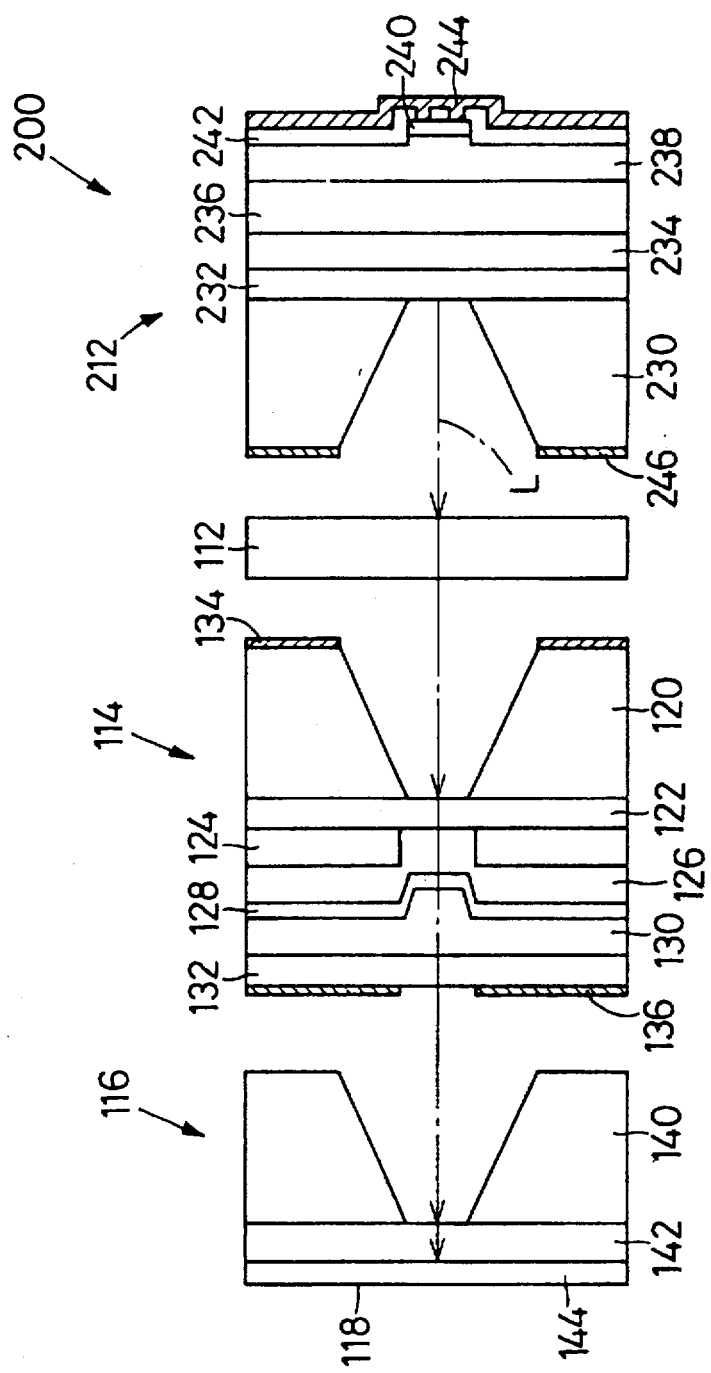
FIG. 14 is a view illustrating a basic arrangement of an electron emitting device constructed according to another embodiment of the present invention.
Figure 15:
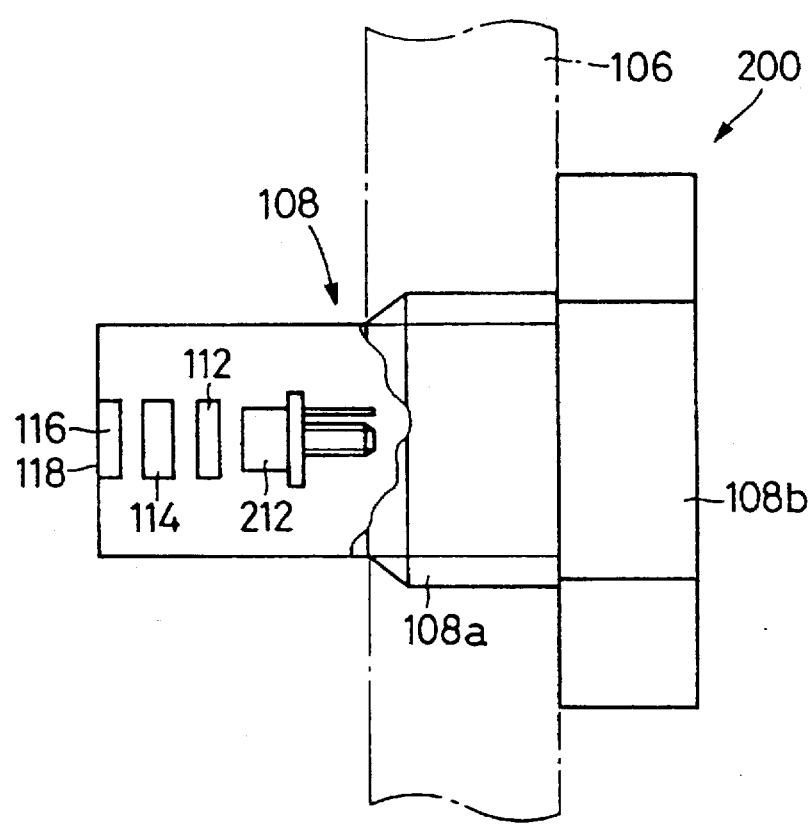
FIG. 15 is a view showing an example of a housing of the device of FIG. 14.

Referring to FIGS. 14 and 15, there is illustrated a spin-polarized electron emitting device 200 constructed according to a further embodiment of this invention. This electron emitting device 200 includes the quarter-wavelength plate 112, optical amplifier 114 and electron emitting element 116, which are used in the embodiment of FIG. 7. The electron emitting device 200 further includes a laser source 212 which is different from the laser source 110 used in the embodiment of FIG. 7, as described below. The components 112, 114, 116 and 212 are fixedly positioned within the housing 108 which is removably attached to the vacuum housing 106, as shown in FIG. 15, in the same manner as described above by reference to FIG. 8 with respect to the embodiment of FIG. 7.

The laser source 212 is a DBR (distributed-Bragg reflector) surface emitting laser diode having a so-called "mesa cap" structure. The laser source 212 includes an n-GaAs semiconductor substrate 230, a multilayered semiconductor reflecting mirror 232, an n-$Al_{0.4}Ga_{0.6}As$ cladding layer 234, a p-$Al_{0.03}Ga_{0.97}As$ active layer 236, a p-$Al_{0.4}Ga_{0.6}As$ cladding layer 238 and a p-$Al_{0.1}Ga_{0.9}As$ cap layer 240. The mirror 232 and the layers 234, 236, 238 and 240 are formed by epitaxy (e.g., MOCVD) on the substrate 230 in the order of description. The multilayered reflecting mirror 232 consists of 15 pairs of alternating n-$Al_{0.6}Ga_{0.4}As$ and n-$Al_{0.1}Ga_{0.9}As$ semiconductor layers superposed on each other. The thickness values of the n-$Al_{0.6}Ga_{0.4}As$ and n-$Al_{0.1}Ga_{0.9}As$ semiconductor layers are determined depending upon the refractive indices and the desired wavelength of the laser radiation L to be generated. The layers 234, 236, 238 and 240 have thickness values of about 1 µm, 3 µm, 1 µm and 0.5 µm, respectively.

The originally formed cap layer 240 and the adjacent cladding layer 238 are subjected to an etching process so that an outer portion of the cap layer 240 is removed over the entire thickness while the corresponding outer portion of the cladding layer 238 is removed through a portion of its thickness. As a result, the cap layer 240 having the original thickness is left at the central portion of the laser source 212. After the etching process, a $Si_3N_4$ layer 242 is formed by vapor deposition, so as to cover the exposed outer portion of the cladding layer 238 and the cap layer 240. The thickness of this layer 242 is equal to one fourth (¼) of the wavelength λ of the laser radiation L. A central portion of the $Si_3N_4$ layer 242 is etched to form an annular groove whose bottom is defined by the cap layer 240. Finally, a Zn/Au electrode 244 is formed so as to cover the $Si_3N_4$ layer 242, such that the annular groove indicated above is filled by the material of the electrode 244. Thus, the laser source 212 has a mesa construction defined by the central portions of the $Si_3N_4$ layer 242 and the electrode 244. These $Si_3N_4$ layer 242 and the electrode 244 serve as a reflecting mirror as described below.

The substrate 230 is etched to form a central recess through which the corresponding central portion of the reflecting mirror 232 is exposed, so as to provide a path of the laser radiation L. A Au/Ge electrode 246 is formed on the front surface of the substrate 230. With an electric current applied between the electrodes 244, 246 in a forward direction, the laser radiation is generated by induced emission in the active layer 236. The laser radiation L is resonated between the reflecting mirror 232 and the electrode 244, and is eventually emitted from the reflecting mirror 232 toward the quarter-wavelength plate 112 through the recess formed in the substrate 230.

In the present electron emitting device 200, all components 212, 112, 114 and 116 are disposed in the single housing 108, in fixed positional relationship with each other, so that the laser radiation L generated from the laser source 212 is incident upon the electron emitting element 116 from its rear side, and the spin-polarized electron beam is emitted from the emitting surface 118 exposed to the interior of the vacuum chamber 106. Thus, the present electron emitting device 200 is compact and relatively easy to handle. More specifically, the device 200 can be readily attached and removed to and from the vacuum chamber 106 of a measuring apparatus, as shown in FIG. 8, when a workpiece or test specimen placed within the vacuum chamber 106 is tested or investigated by means of the spin-polarized electron beam emitted from the emitting surface 118 of the electron emitting element 116, as in the case of observation of a magnetic domain of a magnetic material. The present device 200 facilitates experiment or observation using a spin-polarized electron beam, and can be utilized for various applications, in combination with different types of measuring apparatuses.

In the electron emitting device 200, the laser radiation L circularly polarized by the quarter-wavelength plate 112 is modulated by the optical amplifier 114 before it is received by the electron emitting element 116. Thus, the intensity of the laser radiation L incident upon the emitting element 116 is suitably changed by controlling the amount of the electric current applied to the optical amplifier 114, as indicated in FIG. 9, whereby the density of the spin-polarized electrons excited by the laser radiation L can be adjusted as needed. Consequently, the present device 200 provides the same advantages as described above with respect to the embodiment of FIG. 7.

Figure 16:
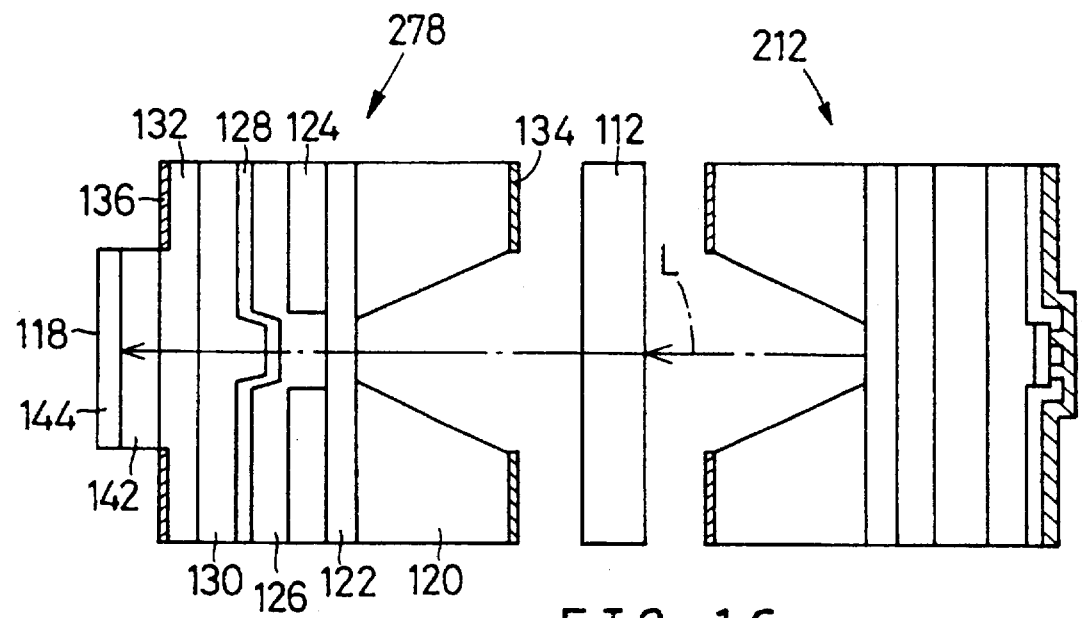
FIG. 16 is a view showing an electron emitting device according to still another embodiment of the invention in which an optical amplifier and a spin-polarized electron source of FIG. 14 constitute an integral structure.

Referring to FIG. 16, there is shown a modification of the embodiment of FIG. 14, which uses a spin-polarized electron source 278 identical with the spin-polarized electron source 148 of FIG. 10. Namely, the first and second semiconductor layers 142, 144 of the emitting element are formed directly on the reflecting mirror 132 of the optical amplifier. Since the electron source 278 does not include the substrate 140, the device of FIG. 16 is more compact than the device 200 of FIG. 14.

Figure 17:
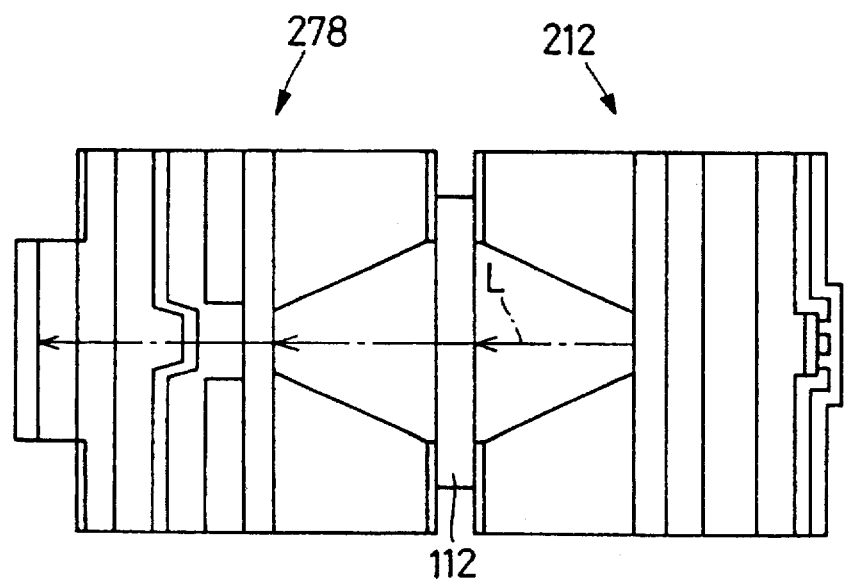
FIG. 17 is a view illustrating yet another embodiment of the invention wherein all components of FIG. 16 are formed to provide an integral structure.

FIG. 17 shows a still further embodiment in which the laser source 212, quarter-wavelength plate 112 and electron source 278 of FIG. 16 are bonded together by suitable bonding means such as an electrically conductive paste, to provide an integral electron emitting device wherein the components have fixed positional relationship with each other. This device can be positioned in the housing 108 with increased ease and accuracy.

Figure 18:
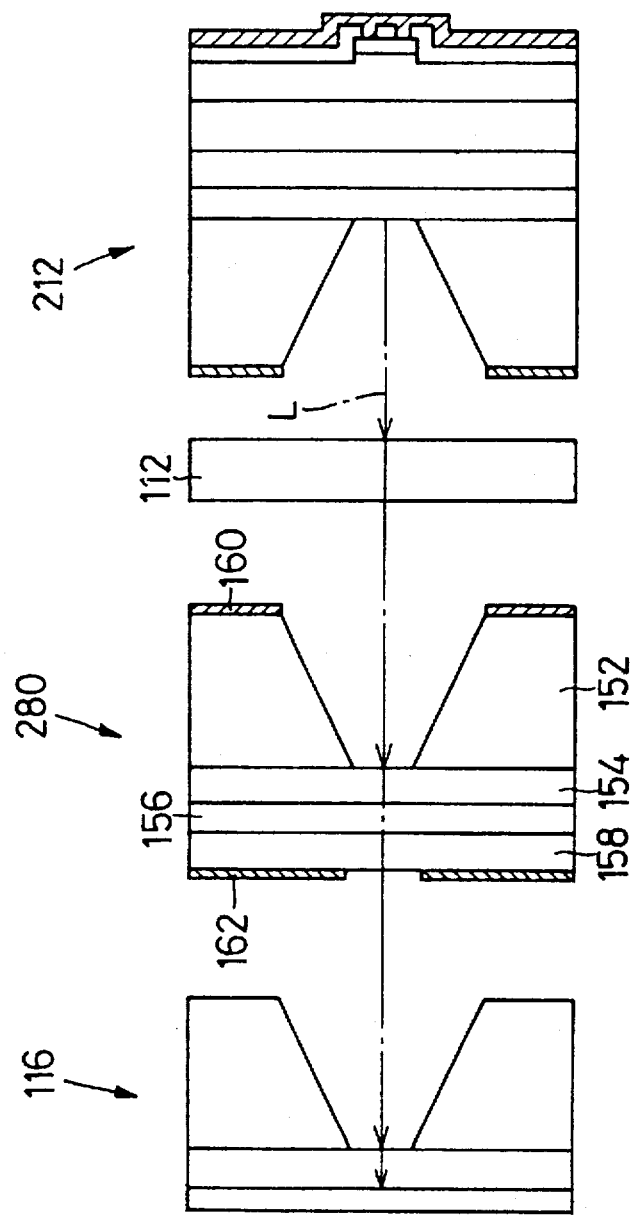
FIG. 18 is a view corresponding to that of FIG. 14, showing a still further embodiment of the invention.

A yet further embodiment of the present invention is illustrated in FIG. 18. This embodiment uses a light modulating element in the form of an optical modulator 280 identical with the modulator 150 of FIG. 11.

Figure 19:
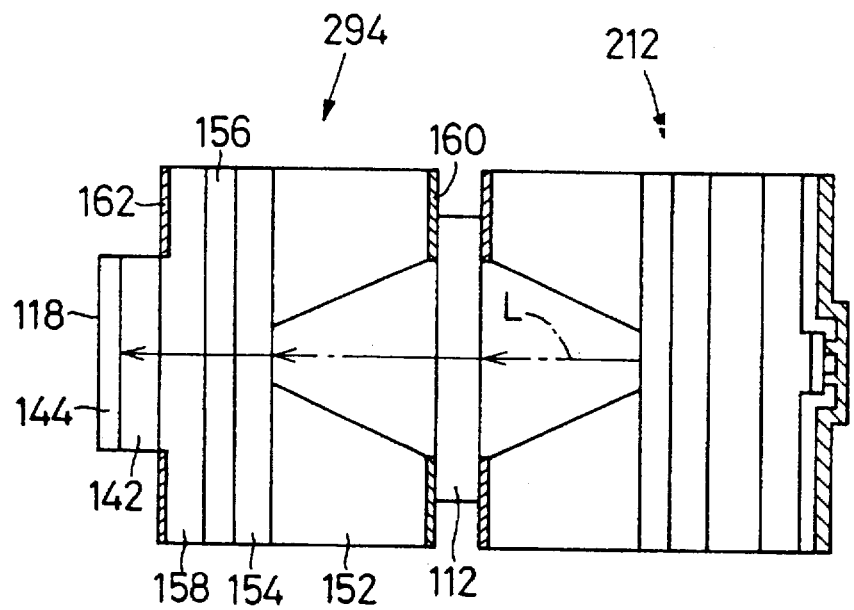
FIG. 19 is a view showing a yet another embodiment of the invention wherein an optical modulator and a spin-polarized electron source of FIG. 18 are formed to provide an integral structure, which is integral with a laser source with a quarter-wave plate interposed therebetween.

FIG. 19 shows a modification of the embodiment of FIG. 18, which includes an electron source 294 in which the first and second semiconductor layers 142, 144 of the electron emitting element are formed directly on the cladding layer 158 of the optical modulator 280. In this respect, the electron source 294 is similar to the electron source 278 of FIGS. 16 and 17. This electron source 294, and the quarter-wavelength plate 112 and the laser source 212 are bonded together to provide an integral electron emitting device.

Figure 20:
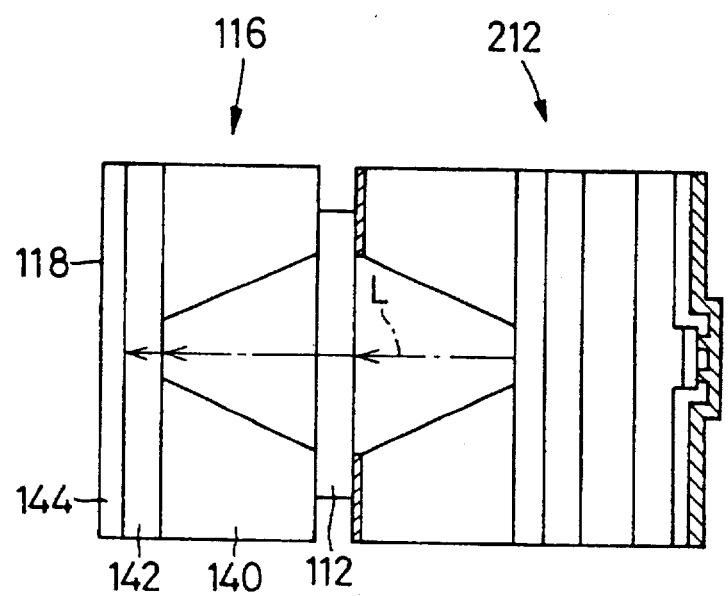
FIG. 20 is a view showing another embodiment of the invention which does not include an optical amplifier of FIG. 14 and in which an electron source, a quarter-wave plate and a laser source are formed to provide an integral structure.

FIG. 20 shows another embodiment of this invention, in which an integral electron emitting device consists of the laser source 212, quarter-wavelength plate 112 and electron emitting element 116 which have been described above. Namely, the electron emitting device according to this embodiment does not include the optical amplifier 114 or modulator 280 as used in the embodiments of FIGS. 14 and 18. The laser source 212, quarter-wavelength plate 112 and electron emitting element 116 may be discrete components as in the embodiments of FIGS. 14, 16 and 18.

Figure 21:
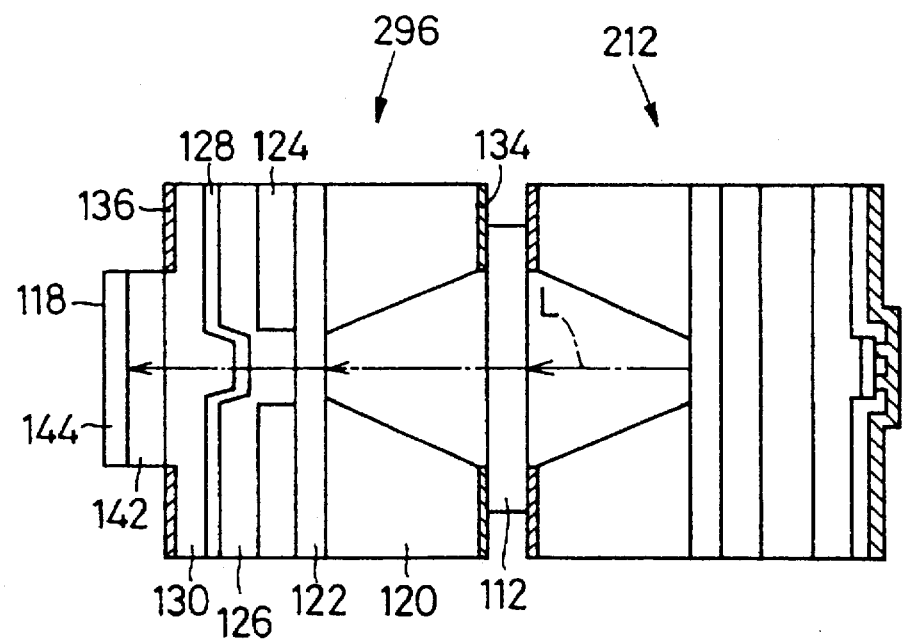
FIG. 21 is a view illustrating a further embodiment of the invention in which a reflecting mirror on the side of the electron emitting surface of the electron source of FIG. 17 is eliminated.

FIG. 21 shows a further embodiment of the invention, which is a modification of the embodiment of FIG. 17. An integral electron emitting device according to this modified embodiment consists of the laser source 212 and the quarter-wavelength plate 112, and an electron source 296 identical with the electron source 166 of FIG. 12. More specifically, the electron source 296 does not include the multilayered semiconductor reflecting mirror 132 as provided in the embodiments of FIGS. 10 and 17. In this embodiment using the electron source 296, however, the laser radiation L is resonated between the reflecting mirror 122 and the electron emitting surface 118, as described above with respect to the embodiment of FIG. 12.

Figure 22:
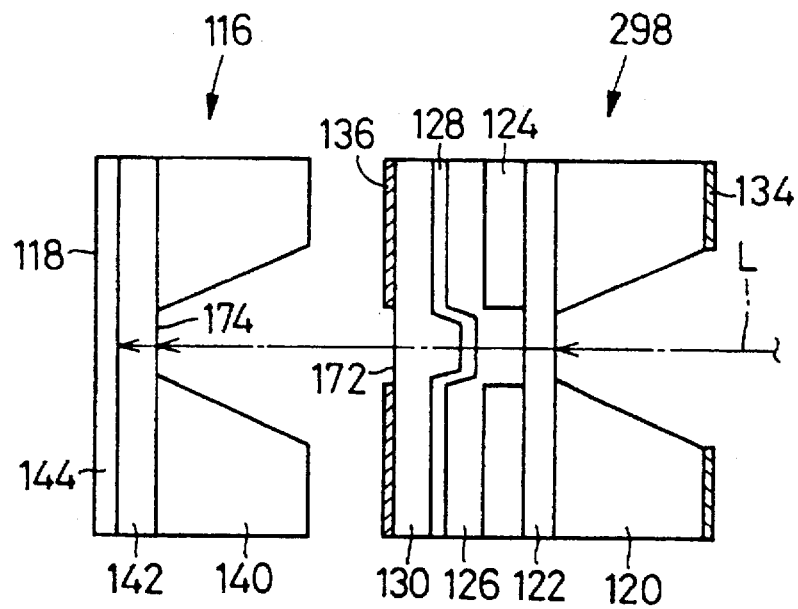
FIG. 22 is a view illustrating a still further embodiment of the invention in which a reflecting mirror on the side of the electron emitting surface of the electron source of FIG. 14 is eliminated.

Referring to FIG. 22, there is shown a yet further embodiment of the invention, which is a modification of the embodiment of FIG. 14. That is, an electron emitting device according to this modified embodiment uses an optical amplifier 298 identical with the optical amplifier 170 of FIG. 13, which does not include the multilayered semiconductor reflecting mirror 132 as used in the embodiments of FIGS. 7, 14 and 16. As described above with respect to the embodiment of FIG. 13, the exposed surfaces 172 and 174 may be coated with non-reflective films, so that the laser radiation L is resonated between the emitting surface 118 and the reflecting mirror 122, so as to amplify the intensity modulation of the laser radiation L and accordingly increase the quantum efficiency, as in the embodiment of FIG. 21.

Figure 23:
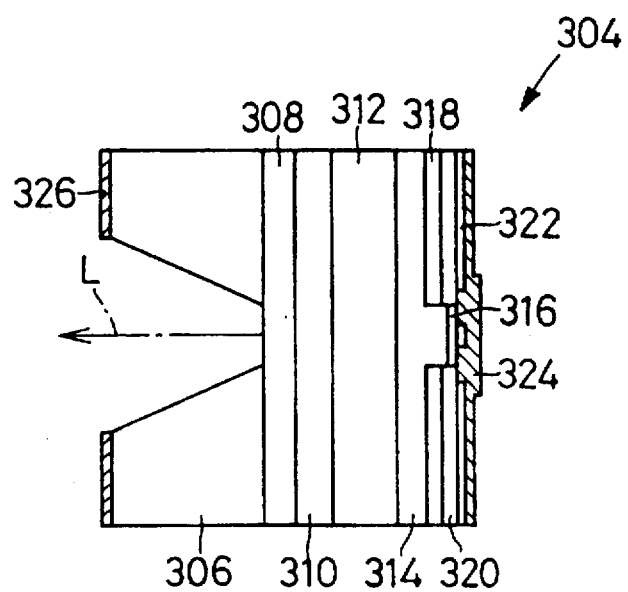
FIG. 23 is a view depicting a modified form of a laser source used in the electron emitting device according to the present invention.

Referring next to FIG. 23, there is shown a laser source 304 used in place of the laser source 212 used in the embodiments of FIGS. 14 and 16–22. This laser source 304 is a DBR (distributed-Bragg reflector) surface emitting laser diode which uses current blocking layers 318 and 320 described below. The laser source 304 includes an n-GaAs semiconductor substrate 306, a multilayered semiconductor reflecting mirror 308, an n-$Al_{0.4}Ga_{0.6}As$ cladding layer 310, a p-$Al_{0.03}Ga_{0.97}As$ active layer 312, a p-$Al_{0.4}Ga_{0.6}As$ cladding layer 314 and a p-$Al_{0.1}Ga_{0.9}As$ cap layer 316. The mirror 308 and the layers 310, 312, 314 and 316 are formed by epitaxy (e.g., MOCVD) on the substrate 306 in the order of description. The multilayered reflecting mirror 308 consists of 15 pairs of alternating n-$Al_{0.6}Ga_{0.4}As$ and n-$Al_{0.1}Ga_{0.9}As$ semiconductor layers superposed on each other. The thickness values of the n-$Al_{0.6}Ga_{0.4}As$ and n-$Al_{0.1}Ga_{0.9}As$ semiconductor layers are determined depending upon the refractive indices and the desired wavelength of the laser radiation L to be generated.

The originally formed cap layer 316 and the adjacent cladding layer 314 are subjected to an etching process so that an outer portion of the cap layer 316 is removed over the entire thickness while the corresponding outer portion of the cladding layer 314 is removed through a portion of its thickness. As a result, the cap layer 316 having the original thickness is left at the central portion of the laser source 304. After the etching process, an n-GaAs current blocking layer 318 and a p-GaAs current blocking layer 320 are formed so as to cover the exposed outer portion of the cladding layer 314 and the cap layer 316. These current blocking layers 318, 320 function to permit an electric current to flow through only a central portion of the laser source 304. The cap layer 316 and the p-GaAs current blocking layer 320 are covered by a SiO$_2$ layer 322 formed by vapor deposition. The thickness of this layer 322 is equal to one fourth (¼) of the wavelength λ of the laser radiation L. A central portion of the SiO$_2$ layer 322 is etched to form an annular groove whose bottom is defined by the cap layer 316. Finally, a Zn/Au electrode 324 is formed so as to cover the SiO$_2$ layer 322, such that the annular groove indicated above is filled by the material of the electrode 324. These SiO$_2$ layer 322 and the electrode 324 serve as a reflecting mirror as described below.

The substrate 306 is etched to form a central recess through which the corresponding central portion of the reflecting mirror 308 is exposed, so as to provide a path of the laser radiation L. A Au/Ge electrode 326 is formed on the front surface of the substrate 306. With an electric current applied between the electrodes 324, 326 in a forward direction, the laser radiation is generated by induced emission in the active layer 312. The laser radiation L is resonated between the reflecting mirror 232 and the electrode 324, and is eventually emitted from the reflecting mirror 308, passing through the recess formed in the substrate 306.

While the present invention has been described in detail in its presently preferred embodiments by reference to the accompanying drawings, it is to be understood that the invention may be otherwise embodied.

In the illustrated embodiments, a strained GaAs semiconductor opto-electronic layer in the form of the second semiconductor layer 18, 144 is used in the electron emitting element 10, 116 or electron source 148, 166, 278, 294, 296. However, the opto-electronic layer may be any other strained compound semiconductor layer, or a chalcopyrite type semiconductor layer which has a split valence band by nature. It is noted that the wavelength of an excitation laser radiation that provides for the maximum spin-polarization percent of the emitted electrons depends on the specific semiconductor opto-electronic layer used in the electron emitting element or electron source.

While the p-GaAs substrate 12, 140 is used in the embodiments of FIGS. 1, 7, 11, 13, 14, 16, 18, 22, any other suitable semiconductor substrate or a silicon (Si) substrate may be used. If an AlGaAs or other transparent substrate is used, it is not necessary to etch the substrate to form a central recess as provided in the illustrated embodiments. This is also true of the substrate of the semiconductor light modulating element 114, 150, 170, 280, 298 or electron source 148, 166, 278, 294, 296, and also true of the substrate of the laser source 212, 304.

Although the first and second semiconductor layers 16, 142, 18, 144 have the thickness values of about 2 μm and 0.085 μm, respectively, the thickness values of these layers may be changed as needed. Further, the carrier concentration of these semiconductor layers, that is, the amount of an impurity doped in these layers, and the kind of the impurity used may be suitably changed.

While the first embodiment of FIG. 1 uses the multilayered semiconductor reflecting mirror 14, this mirror semiconductor mirror may be replaced by a multilayered dielectric mirror or an ordinary mirror formed on the surface of the substrate 12 remote from the semiconductor layers 16, 18. Similarly, the reflecting mirror 122, 132 used in the light modulating element 114 and the electron source 278, for example, may be modified as needed. For instance, the mirror 122, 132 may be replaced by a multilayered dielectric reflecting mirror or a metallic reflecting mirror, or a combination of such dielectric and metallic mirrors. In the embodiments of FIGS. 14 and 23, the dielectric Si$_3$N$_4$ layer 242 or SiO$_2$ layer 322 and the metallic electrode 244 or 324 cooperate to serve as a reflecting mirror, any other reflecting mirror may be used.

The optical amplifier or modulator 114, 150, 170, 280, 298 used in the illustrated embodiments may be modified as needed, in terms of the compositions and the thickness of the individual constituent layers. While the amplifier or modulator 114, 150, 170, 280, 298 has a double heterostructure, a single heterostructure may be employed. Further, the laser source 212, 304 may also be modified as desired. For instance, the laser source may be a semiconductor laser diode of a multiple quantum well type or an edge emitting type in which a laser radiation is emitted from an edge face of an active layer.

In the embodiments of FIGS. 7–13, the electron source (114, 116, 148, 150, 166, 170) is also positioned within the housing 108, together with the quarter-wavelength plate 112 and the laser source 110, as indicated in FIG. 15. However, the electron source may be positioned within a vacuum chamber of a testing or measuring apparatus, independently of the plate 112 and the laser source 110 disposed in the apparatus.

In the embodiments of FIGS. 14–23, a light modulating element such as an optical amplifier or modulator is not essential, as evidenced by the embodiment of FIG. 20. Further, an optical isolator may be interposed between the laser source 212, 304 and the quarter-wavelength plate 112, or between the quarter-wavelength plate 112 and the optical amplifier 114 or modulator 280, for example.

While the housing 108 has the externally threaded portion 108a at which the housing 108 is screwed to the vacuum chamber 106 of the measuring apparatus, the housing may be modified as needed, in terms of the configuration and the connecting or fixing means with respect to the vacuum chamber 106.

It is to be understood that the present invention may be embodied with various other changes, modifications and improvements, which may occur to those skilled in the art, without departing from the spirit and scope of the invention defined in the following claims.

What is claimed is:

1. An electron emitting element comprising:

a semiconductor opto-electronic layer having a split valence band, said opto-electronic layer emitting a beam of spin-polarized electrons from an emitting surface thereof upon incidence of an excitation laser radiation upon said emitting surface; and a reflecting mirror formed on one of opposite sides of said opto-electronic layer remote from said emitting surface, said reflecting mirror reflecting said laser radiation and cooperating with said emitting surface to effect multiple reflection therebetween of said laser radiation, and wherein said reflecting mirror comprises a multilayered reflecting mirror including a plurality of pairs of alternating p-Al$_{0.6}$Ga$_{0.4}$As layers and p-Al$_{0.1}$Ga$_{0.9}$As layers.

2. An electron emitting element comprising:

a semiconductor opto-electronic layer having a split valence band, said opto-electronic layer emitting a beam of spin-polarized electrons from an emitting surface thereof upon incidence of an excitation laser radiation upon said emitting surface;

a reflecting mirror formed on one of opposite sides of said opto-electronic layer remote from said emitting surface, said reflecting mirror reflecting said laser radiation and cooperating with said emitting surface to effect multiple reflection therebetween of said laser radiation; and a first semiconductor layer grown by epitaxy on said reflecting mirror and interposed between said reflecting mirror and said opto-electronic layer which serves as a second semiconductor layer, and wherein said first and second semiconductor layers have a lattice mismatch that causes said second semiconductor layer to be strained to give energy level splitting between a heavy-hole sub-band and a light-hole sub-band of said valance band, a distance between said emitting surface of said opto-electronic layer as said second semiconductor surface and said reflecting mirror being determined so as to permit resonance of said excitation laser radiation between said emitting surface and said reflecting mirror.

3. An electron emitting element according to claim 2, wherein said distance is determined such that a value $2(t_1 n_1 + t_2 n_2)$ is a multiple of a wavelength of said laser radiation, wherein $t_1$ and $t_2$ represent thickness values of said first and second semiconductor layers, respectively, while $n_1$ and $n_2$ represent refractive indices of said first and second semiconductor layers, respectively.

* * * * *